(12) United States Patent
Vinciarelli et al.

(10) Patent No.: US 9,387,633 B1
(45) Date of Patent: Jul. 12, 2016

(54) ENCAPSULATION METHOD FOR ELECTRONIC MODULES

(71) Applicant: VI Chip, Inc., Andover, MA (US)

(72) Inventors: Patrizio Vinciarelli, Boston, MA (US); Michael B. LaFleur, East Hampstead, NH (US)

(73) Assignee: VI Chip, Inc., Andover, MA (US)

( * ) Notice: Subject to any disclaimer, the term of this patent is extended or adjusted under 35 U.S.C. 154(b) by 391 days.

(21) Appl. No.: 13/867,807

(22) Filed: Apr. 22, 2013

Related U.S. Application Data

(62) Division of application No. 12/493,773, filed on Jun. 29, 2009, now Pat. No. 8,427,269.

(51) Int. Cl.
| | |
|---|---|
| *B29C 43/10* | (2006.01) |
| *B29C 70/72* | (2006.01) |
| *B29C 43/04* | (2006.01) |
| *H01L 21/56* | (2006.01) |
| *B29C 43/00* | (2006.01) |

(52) U.S. Cl.
CPC ............... *B29C 70/72* (2013.01); *B29C 43/00* (2013.01); *B29C 43/04* (2013.01); *H01L 21/56* (2013.01); *H01L 21/565* (2013.01)

(58) Field of Classification Search
CPC ........ B24C 45/00; B29C 43/00; B29C 43/04; B29C 70/72; H01L 21/56; H01L 21/565
See application file for complete search history.

(56) References Cited

U.S. PATENT DOCUMENTS

| | | | |
|---|---|---|---|
| 3,613,229 A | 10/1971 | Olsen et al. | |
| 4,777,465 A | 10/1988 | Meinel | |
| 5,134,773 A | * 8/1992 | LeMaire | ........... B29C 45/14467 174/545 |
| 5,378,966 A | 1/1995 | Marszalik | |
| 5,474,958 A | * 12/1995 | Djennas | ................. H01L 21/565 257/676 |
| 5,719,483 A | 2/1998 | Abbott et al. | |
| 5,728,600 A | 3/1998 | Saxelby, Jr. et al. | |
| 5,787,569 A | 8/1998 | Lotfi et al. | |

(Continued)

FOREIGN PATENT DOCUMENTS

| | | |
|---|---|---|
| JP | 2002164229 | 6/2002 |
| JP | 2005-050918 | 2/2005 |
| JP | 2005050618 | 2/2005 |

OTHER PUBLICATIONS

Non-Final Office Action; U.S. Appl. No. 12/493,773; Aug. 5, 2011.

(Continued)

*Primary Examiner* — Carl Arbes
(74) *Attorney, Agent, or Firm* — Fish & Richardson P.C.

(57) ABSTRACT

An encapsulated electronic device includes a magnetically permeable core structure which is exposed within and coplanar with a flat top surface of the device. A bottom surface of the core may be exposed within the bottom surface of the device. The bottom core surface may be recessed beneath, coplanar with, or protruding from the bottom surface of the device. Alternatively the bottom surface may be encapsulated within the device. A method for manufacturing the exposed core package includes positioning a first component relative to a second component before encapsulating the device. An improved planar magnetic core structure includes internal bevels having a radius greater than or equal to 15% and preferably 25%, 35%, or as much as 50% of the core thickness to reduce concentration of the magnetic field around the internal corners.

32 Claims, 22 Drawing Sheets

(56) References Cited

U.S. PATENT DOCUMENTS

| | | | |
|---|---|---|---|
| 5,926,373 A | 7/1999 | Stevens | |
| 6,087,917 A | 7/2000 | Roessler et al. | |
| 6,208,531 B1 | 3/2001 | Vinciarelli et al. | |
| 6,261,501 B1 * | 7/2001 | Miyagawa | B29C 45/14655 257/E21.503 |
| 6,338,813 B1 * | 1/2002 | Hsu et al. | 264/272.14 |
| 6,392,519 B1 | 5/2002 | Ronning | |
| 6,403,009 B1 | 6/2002 | Saxelby, Jr. et al. | |
| 6,523,254 B1 * | 2/2003 | Street et al. | 29/841 |
| 6,636,140 B2 | 10/2003 | Fujiyoshi et al. | |
| 6,657,528 B1 | 12/2003 | Tang | |
| 7,187,263 B2 | 3/2007 | Vinciarelli | |
| 7,233,225 B2 | 6/2007 | Sato | |
| 7,236,086 B1 | 6/2007 | Vinciarelli et al. | |
| 7,361,844 B2 | 4/2008 | Vinciarelli et al. | |
| 7,651,958 B2 * | 1/2010 | Morita et al. | 438/781 |
| 8,427,267 B1 | 4/2013 | Vinciarelli | |
| 8,427,269 B1 | 4/2013 | Vinciarelli et al. | |
| 2001/0020886 A1 | 9/2001 | Matsumoto et al. | |
| 2002/0015748 A1 * | 2/2002 | Miyajima et al. | 425/89 |
| 2005/0206487 A1 | 9/2005 | Honsberg-Riedl et al. | |
| 2005/0231316 A1 | 10/2005 | Sato | |
| 2006/0006970 A1 | 1/2006 | Ooki | |
| 2006/0032043 A1 | 2/2006 | Lin | |
| 2007/0216021 A1 * | 9/2007 | Morita et al. | 257/701 |
| 2010/0213623 A1 * | 8/2010 | Isshiki et al. | 257/791 |

OTHER PUBLICATIONS

Reply to Action of Aug. 5, 2011; U.S. Appl. No. 12/493,773; Dec. 15, 2011.
Final Office Action; U.S. Appl. No. 12/493,773; Apr. 25, 2012.
Reply to Action of Apr. 25, 2012; U.S. Appl. No. 12/493,773; Jun. 29, 2012.
Notice of Allowance; U.S. Appl. No. 12/493,773; Dec. 24, 2012.

* cited by examiner

ENCAPSULATION METHOD FOR ELECTRONIC MODULES

CROSS-REFERENCE TO RELATED APPLICATIONS

This application is a divisional application of, and claims priority to, U.S. application Ser. No. 12/493,773, filed on Jun. 29, 2009. This application is related to U.S. application Ser. No. 12/493,759, filed on Jun. 29, 2009, titled "Encapsulation Method and Apparatus for Electronic Modules." The contents of the above applications are incorporated by reference.

TECHNICAL FIELD

This invention relates to over-molded packages for electronic modules such as power converter modules that include inductive components such as inductors and transformers.

BACKGROUND

An encapsulated electronic module, such as an electronic power converter module for example, may comprise a printed circuit assembly over-molded with an encapsulant to form some or all of the package and exterior structure or surfaces of the module. Encapsulation in this manner may aid in conducting heat out of the over-molded components, i.e., components that are mounted on the printed circuit assembly and covered with encapsulant. In the case of an electronic power converter module, the printed circuit assembly may include one or more inductive components, such as inductors and transformers. Encapsulated electronic power converters are described in Vinciarelli et al., Power Converter Package and Thermal Management, U.S. Pat. No. 7,361,844, issued Apr. 22, 2008, assigned to VLT, Inc. of Sunnyvale, Calif. and incorporated by reference in its entirety (the "Converter Package Patent").

Methods of over-molding both sides of a printed circuit board assembly while leaving opposing regions on both sides of the printed circuit board free of encapsulant are described in Saxelby, et al., Circuit Encapsulation Process, U.S. Pat. No. 5,728,600, issued Mar. 17, 1998 and Saxelby, et al., Circuit Encapsulation, U.S. Pat. No. 6,403,009, issued Jun. 11, 2002 (collectively the "Molding Patents") (both assigned to VLT, Inc. of Sunnyvale, Calif. and incorporated by reference in their entirety).

Protecting an over-molded permeable magnetic component from mechanical stress by use of a compliant buffer coating is described in Lofti et al, U.S. Pat. No. 5,787,569, "Encapsulating Package for Power Magnetic Devices and Method of Manufacture Thereof" Combining an un-encapsulated permeable magnetic component and an over-molded circuit assembly is described by Vinciarelli et al, in Power Converter Configuration, Control and Construction, U.S. Pat. No. 7,236,086, issued Jun. 26, 2007; and Power Converter Having Magnetically Coupled Control, U.S. Pat. No. 6,208,531, issued Mar. 27, 2001; both assigned to VLT, Inc. of Sunnyvale, Calif. An inductive charger including a permeable magnetic component in which a surface of the magnetic component may be exposed after over-molding is described in Abbott et al, Inductive Coupling Wand Having a Molded Magnetic Core, U.S. Pat. No. 5,719,483.

SUMMARY

In one aspect, in general, an electronic module includes an electronic assembly that has electronic circuitry, a contact structure for making electrical connections to the circuitry, and a core structure for directing a magnetic field along a flux path, the core structure having a core surface. The electronic module includes encapsulation material surrounding portions of the electronic assembly and forming an external surface of the electronic module. A first portion of the core surface is substantially parallel to the flux path and exposed within the external surface.

Implementations of the electronic module can include one or more of the following features. The core structure can include a magnetically permeable material having a permeability to define the flux path.

The core structure can include gaps in the permeability along the flux path, the gaps can be encapsulated within the module, and the exposed first portion of the core surface can be free of gaps. The electronic assembly can include a printed circuit board ("PCB") having a first area including traces forming part of at least one winding. The core structure can include an internal space having an internal core surface surrounding the first area of the PCB, the internal core surface being separated from the first area by a predetermined minimum distance filled with encapsulant. The core structure can include a path thickness perpendicular to the flux path in a direction radially outward from the internal perimeter of the flux, and a minimum radius along the internal perimeter of the flux path, the minimum radius being at least 15% of the path thickness. The minimum radius can be at least 15% of the path thickness. The external surface can include a second flat area separated by a distance from the first flat area, wherein the distance is normal to the first flat area. The core surface can include a second portion substantially parallel to the flux path and separated from the exposed first portion by a distance normal to the exposed first portion, and the second portion of the core can be exposed within the second flat area. The minimum radius can be at least 25% of the path thickness.

The exposed first portion of the core surface can be substantially flat. The external surface can include a first flat area and the exposed first portion of the core surface can be exposed within and coplanar with the first flat area. The first flat area can form a top surface of the electronic module. The apparatus can include a controlled dimension between the exposed first portion of the core and the contact structure. The contact structure can include a contact surface parallel to and below the first flat area and separated by the controlled distance from the first flat area.

The external surface can include a second flat area separated by a distance from the first flat area, wherein the distance is normal to the first flat area. The core surface can include a second portion substantially parallel to the flux path and separated from the exposed first portion by a distance normal to the exposed first portion. The second portion of the core can be exposed within the second flat area. In some examples, the exposed second portion can be flat and recessed from the second flat area. In some examples, the exposed second portion can be flat and coplanar with the second flat area. The exposed second portion can protrude from the second flat area.

The external surface can include a second flat area separated by a distance from the first flat area, wherein the distance can be normal to the first flat area. The core surface can include a second portion substantially parallel to the flux path and separated from the exposed first portion by a distance normal to the exposed first portion. The second portion of the core can be encapsulated within the module beneath the second flat area.

The exposed first portion of the core surface can be free of gaps in magnetic permeability.

The electronic module can be a self-contained switching power converter having an input for receiving electrical energy from a source and an output for supplying electrical energy to a load.

In another aspect, in general, a method of forming an encapsulated electronic device includes providing an electronic assembly including a first component having a first structure moveable with respect to a second structure, providing a mold for encapsulating the electronic assembly and for forming at least a portion of an exterior shape of the encapsulated electronic device with cured encapsulant, closing a mold around at least a portion of the electronic assembly, positioning the first structure relative to the second structure, and filling the mold with an encapsulating material.

Implementations of the method can include one or more of the following features. The positioning can include clamping the second structure relative to the mold and biasing the first structure in position against a predetermined feature of the mold. The predetermined feature can be an inner surface of the mold. The biasing can include using a compliant pad between the mold and the first structure to apply compliant pressure to the first structure. The compliant pad can be affixed to the first structure before closing the mold around the electronic assembly. The compliant pad can be affixed to a sheet, and the method can further include placing the sheet in the mold before closing the mold around the electronic assembly. The method can include providing a moveable insert in a portion of the mold, the moveable insert having an insert surface for engaging and applying pressure to the first structure. The second structure can include a printed circuit board ("PCB") and the first structure can include a core structure for directing a magnetic field along a flux path, the core structure having a first core surface and wherein the predetermined feature is a first inner surface of the mold.

The first inner surface of the mold can be contoured to produce a resulting flat exterior top surface for the electronic device after encapsulation. The first core surface can be essentially flat and the positioning can include moving the first core surface against the first inner surface forming a seal to leave the first core surface exposed within and coplanar with the resulting flat exterior top surface. The mold insert can be provided in a bottom portion of the mold, adapted to push the core structure upward against the first inner surface. The insert surface can be adapted to form a seal against a second surface of the core structure to leave the second surface of the core structure exposed within a resulting exterior bottom surface of the device.

The mold insert can protrude from a bottom interior surface of the mold to produce a recess in the resulting exterior bottom surface of the electronic device after encapsulation and the core structure can be exposed within the recess. The method can include adapting the core structure to move over a range relative to the PCB, and providing a minimum clearance between the core structure and the PCB over the range. The encapsulated electronic device can include a power converter.

In another aspect, in general, an apparatus includes a core structure having a first core piece having a back section and a first leg for directing a first magnetic field along a flux path in the core. The back section can have an exterior back surface and an interior back surface separated by a back thickness, the back thickness being generally normal to the first flux path. The first leg can have an exterior leg surface and an interior leg surface separated by a leg thickness, the leg thickness being generally normal to the flux path. The interior back surface and the interior leg surface can include a bevel having a radius greater than or equal to 15% of the back thickness.

Implementations of the apparatus can include one or more of the following features. The bevel can be rounded. The bevel can include one or more segments approximating a rounded surface. The first core piece can further include a second leg having an exterior leg surface and an interior leg surface separated by a leg thickness, the leg thickness being generally normal to the flux path, and the interior back surface and the interior leg surface of the second leg can be joined by a bevel having a radius greater than or equal to 15% of the back thickness. In some examples, one or more of the bevels can have a radius greater than or equal to 25% of the back thickness. In some examples, one or more of the bevels can have a radius greater than or equal to 35% of the back thickness. The core structure can further include a second core piece adapted to mate with the first and second legs of the first core piece for directing the magnetic field along a flux path that includes in series the first leg, the back section, the second leg, and the second core piece. The core structure can further include a second core piece having a back section, a first leg, and a second leg, for directing the magnetic field along a flux path in the core. The back section of the second core piece can have an exterior back surface and an interior back surface separated by a back thickness generally normal to the flux path. The first and second legs of the second core piece each can have an exterior leg surface and an interior leg surface separated by a leg thickness, the leg thickness being generally normal to the flux path. The interior back surface and the interior leg surfaces of the first and second legs of the second core piece can include bevels having a radius greater than or equal to 15% of the back thickness. The first and second core pieces can be adapted to mate together with the first and second legs meeting at first and second interfaces.

In some examples, one or more of the bevels can include a radius greater than or equal to 25% of the back thickness. In some examples, one or more of the bevels can include a radius greater than or equal to 35% of the back thickness. The first and second core pieces each can include a center leg between the first and second legs, each center leg having interior leg surfaces separated by a center leg thickness, each interior leg surface being connected to the interior back surface by a bevel having a radius greater than or equal to 15% of the back thickness, and wherein the center legs meet at a center interface. At least one of the interfaces can include a gap in magnetic permeability. The exterior back surface can be essentially flat. The first and second core pieces can include a magnetically permeable material. The exterior of the core structure along an outside perimeter of the flux path can include a generally rectangular shape. The leg thicknesses can be approximately equal to the back thicknesses, and the center leg thicknesses can be approximately double the back thickness.

In some examples, the bevels can include a radius greater than or equal to 25% of the back thickness. In some examples, the bevels can include a radius greater than or equal to 35% of the back thickness. In some examples, the bevels can include a radius greater than or equal to 50% of the back thickness. The flux path can include an interior perimeter, the interior perimeter of the flux path can include one or more bends, each bend including a radius, and each radius being greater than or equal to 25% of the back thickness. The flux path can include one or more interior perimeters, each interior perimeter of the flux path including one or more bends, each bend including a radius, and each radius being greater than or equal to 25% of the back thickness.

In another aspect, in general, an apparatus includes a planar magnetic core structure including one or more loops of magnetically permeable material for directing a magnetic field along a flux path having an inner perimeter and an outer perimeter defined by its respective loop, the loop having a loop thickness defined by the distance between its respective inner perimeter and outer perimeter. The core structure has a first generally flat exterior surface along and parallel to a first section of the outer perimeter of the flux path, wherein each inner perimeter includes one or more bends, each bend including a radius, and each radius being greater than or equal to 15% of the loop thickness.

Implementations of the apparatus can include one or more of the following features. The structure can further include a second generally flat exterior surface along and parallel to a second section of the outer perimeter of the flux path, the second generally flat exterior surface being generally parallel to the first generally flat exterior surface. In some examples, each radius can be greater than or equal to 25% of the loop thickness. In some examples, each radius can be greater than or equal to 35% of the loop thickness. The apparatus can further include power conversion circuitry including an inductive element having a conductive winding that includes one or more turns encircling a portion of at least one of the one or more loops, wherein the turns have a conductor width and the conductor width is less than or equal to the loop thickness.

DESCRIPTION OF DRAWINGS

We first briefly describe the drawings.

Like reference symbols in the various drawings indicate like elements.

DETAILED DESCRIPTION

Figure 1:
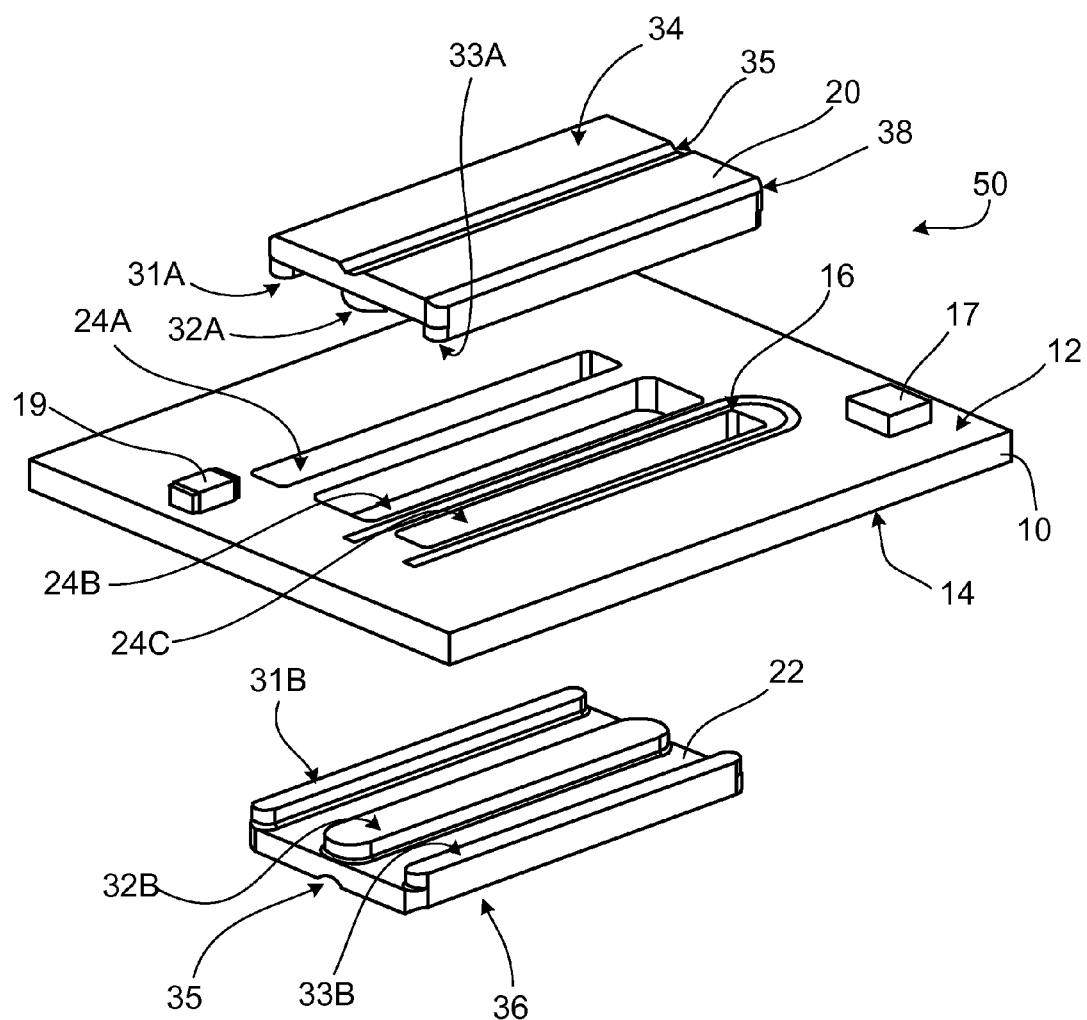
FIG. 1 is an exploded perspective view of a printed circuit assembly.
Figure 2A:
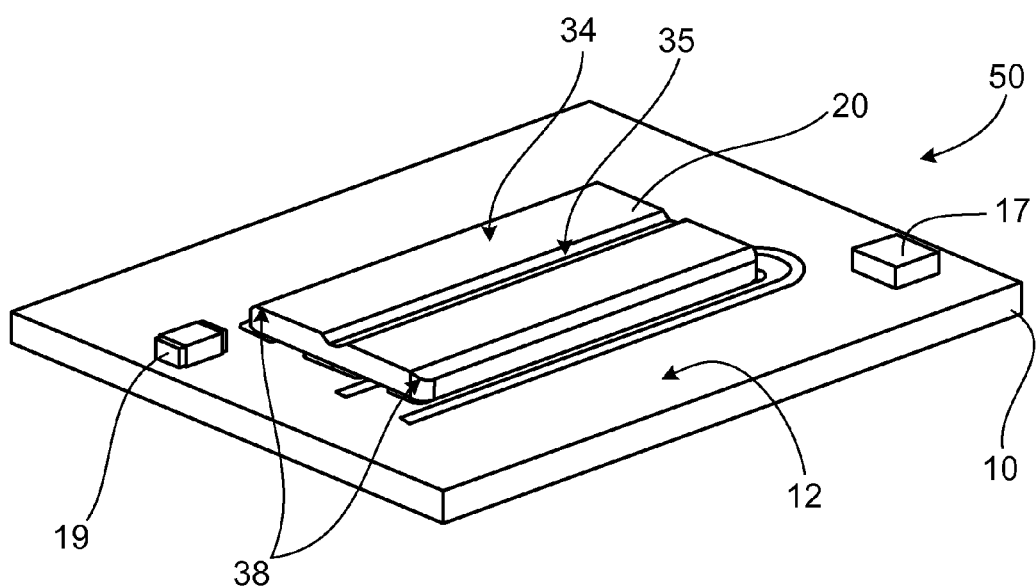
FIGS. 2A and 2B are, respectively, top and bottom perspective views of a printed circuit assembly.
Figure 2B:
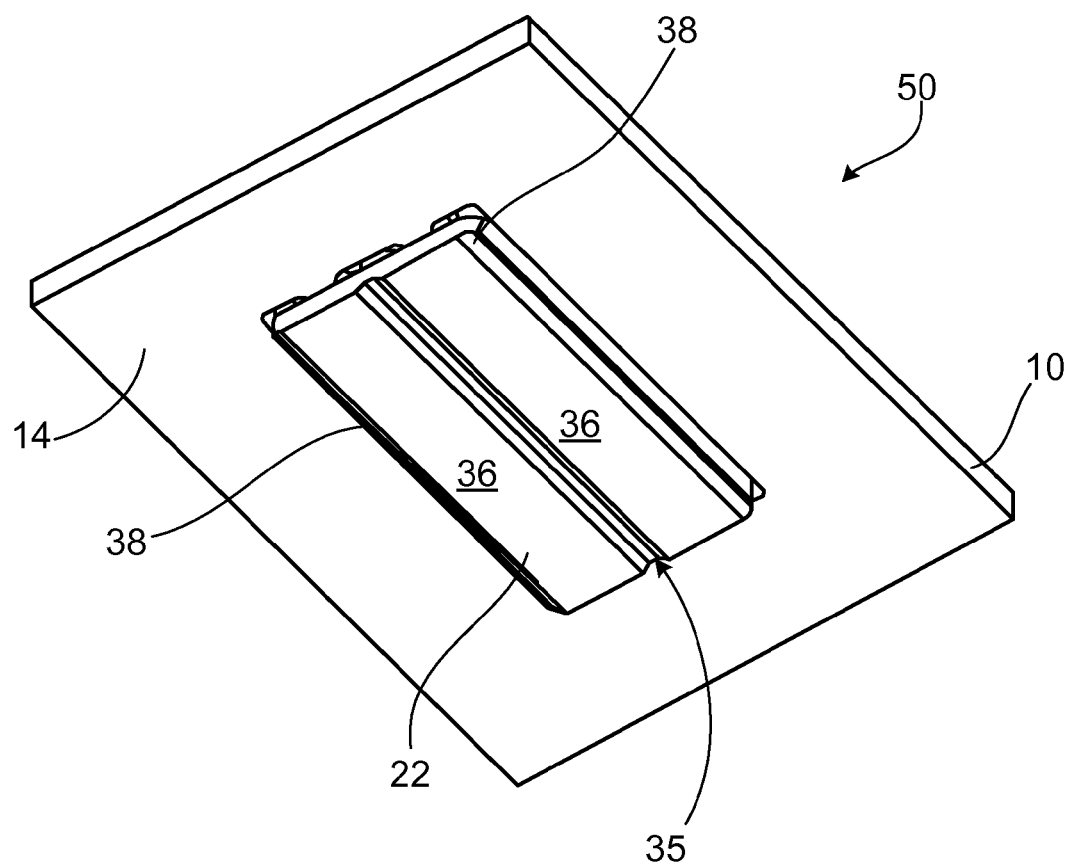

An example of a printed circuit board assembly 50, such as a power converter, is shown prior to encapsulation in FIGS. 1, 2A, and 2B. In the exploded perspective view of FIG. 1, the printed circuit board assembly 50 is shown including a printed circuit board ("PCB") 10 having a top surface 12 and a bottom surface 14 and active and passive components such as components 17 and 19. The PCB assembly 50 is shown including an inductive component, which may be a transformer, having top and bottom magnetically permeable core pieces 20, 22 and one or more windings. The windings may be formed from conductive traces on one or more layers of PCB 10. One such winding 16 is illustrated in FIG. 1. For use in an encapsulated assembly, the permeable core pieces 20, 22 may have flat grooved top and bottom surfaces 34, 36 respectively as shown in FIG. 1.

As illustrated in FIG. 1, the inductive component may be configured by installing the magnetically permeable core pieces 20, 22 into slots 24a, 24b, 24c formed in the PCB 10 with opposing pairs of core faces 31a, 31b; 32a, 32b; 33a, 33b passing through the slots. Cores of the type shown in FIG. 1 are known in the field of planar magnetics and are commonly used in applications where size reduction is important. Opposing core faces may be arranged to either come in contact with each other without a gap or to be in close proximity to each other so that a gap is formed between the core faces. Referring to the top and bottom perspective views of FIGS. 2A and 2B, the PCB assembly 50 is shown with the core pieces 20, 22 installed onto the PCB 10. As illustrated in FIGS. 2A and 2B, the inductive component that is formed in this way may have an essentially flat grooved top surface 34 that lies above the top surface 12 of the PCB 10 and an essentially flat grooved bottom surface 36 that lies below the bottom surface 14 of the PCB. Printed circuit transformers of this kind are described in Vinciarelli, Printed Circuit Transformer, U.S. Pat. No. 7,187,263, issued Mar. 6, 2007, assigned to VLT, Inc. of Sunnyvale, Calif. and incorporated by reference in its entirety (the "Transformer Patent").

Figure 3:
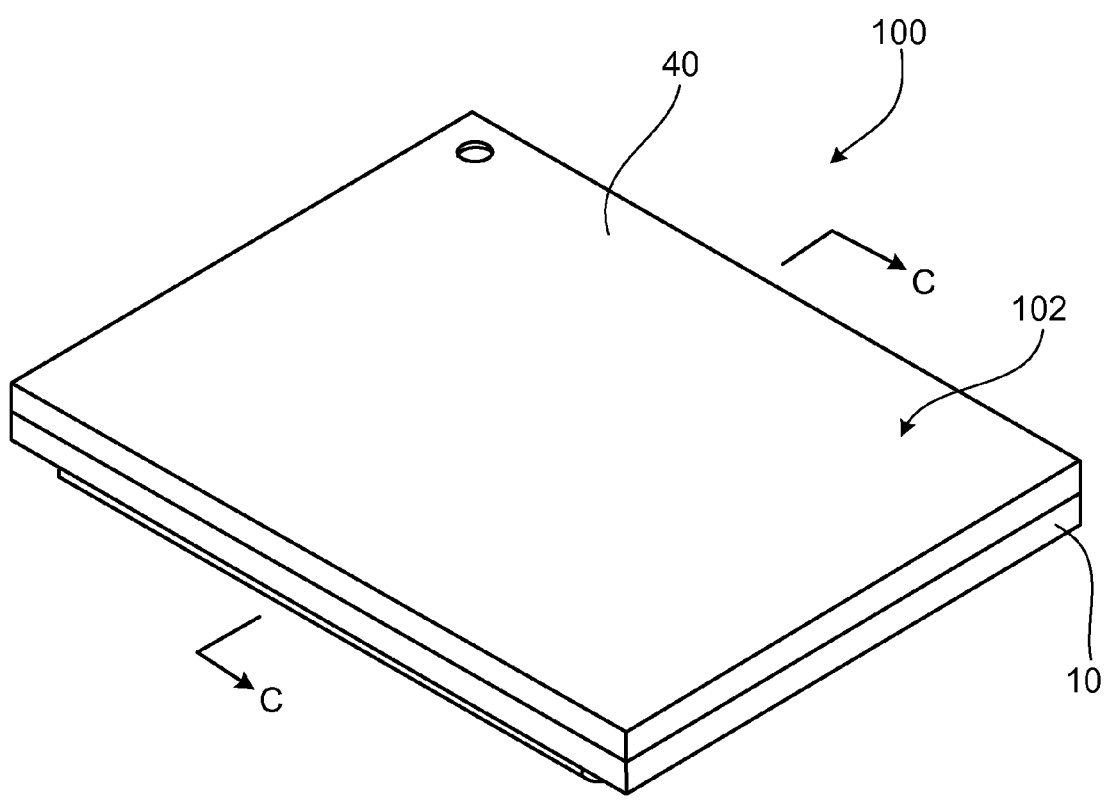
FIG. 3 is a top perspective view of a prior art over-molded module assembly.
Figure 4:
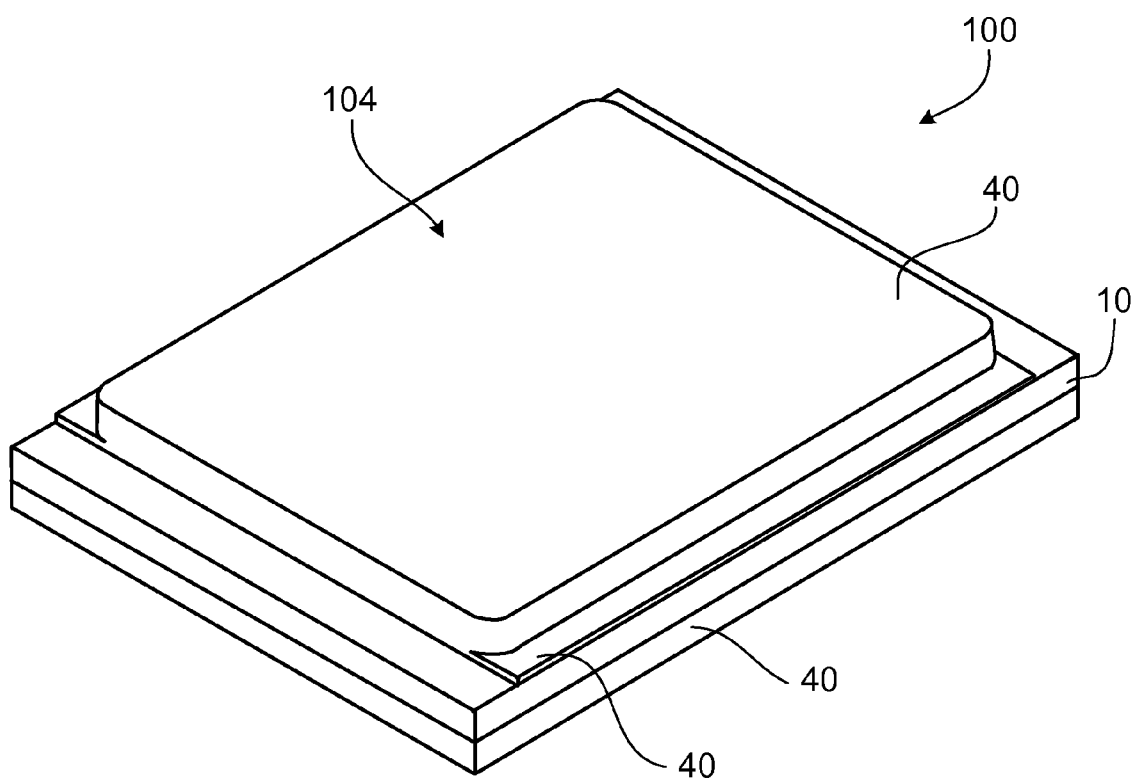
FIG. 4 is a bottom perspective view of a prior art over-molded module assembly.

Traditionally in encapsulated power converter assemblies, all components, including the inductive components and their respective core pieces, have been over-molded, i.e. covered with encapsulant, for example as shown in FIGS. 3 and 4. Covering all of the components including the magnetic core pieces provided a controlled thickness dimension for the finished assembly while accommodating variations in thickness of the components, e.g. the core pieces. Additionally, the core pieces were treated as components requiring encapsulation for mechanical and electrical safety reasons. For example, enclosing the cores provided a uniform, co-planar top surface and a layer of dielectric insulation over the cores.

FIGS. 3 and 4 respectively show top and bottom perspective views of a prior art package 100 described in the Converter Package Patent. Note the distinction between the form of the package resulting from encapsulation (shown in FIGS. 3-5) and the components (shown in FIGS. 1, 2A, 2B, and 5) internal to the package. While the exterior shape and structure of the over-molded package shown in FIGS. 3 and 4 may be found in the prior art, the assembly being encapsulated and its components need not be. Therefore reference to the package shown in FIGS. 3, 4, and 5 as prior art is a reference to the encapsulation form and method for producing that form, not the internal components.

Figure 5:
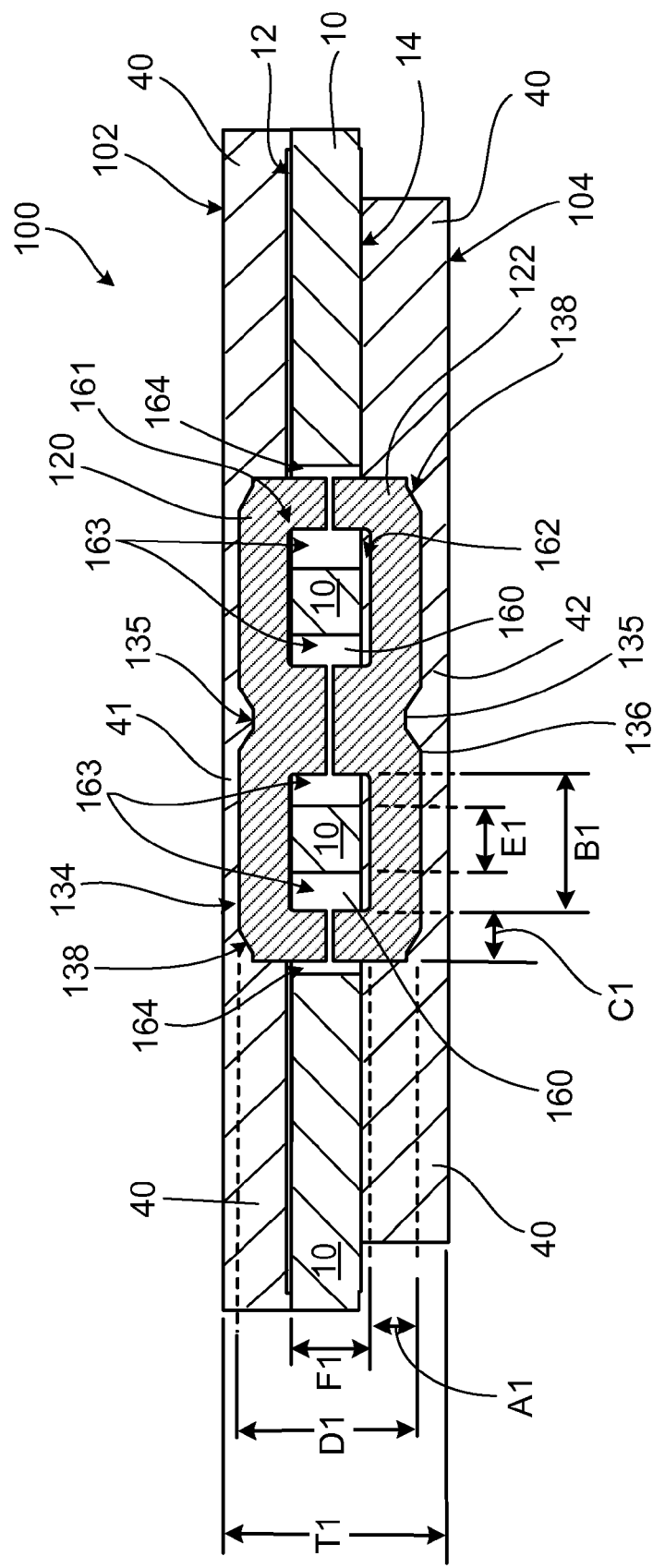
FIG. 5 is a cross-sectional view of the assembly of FIGS. 3 and 4.

The over-molded assembly 100 may be formed e.g. by encapsulating the printed circuit assembly 50 of FIGS. 1 and 2 using an encapsulating material 40. As shown in FIGS. 3 and 4, the module 100 top surface 102 and the module bottom surface 104 are formed entirely of cured encapsulating material 40. As shown, edges of the PCB 10 are exposed along and thus form portions of the sides of the assembly's 100 exterior. Referring to FIG. 5, the cross-section (taken along C-C in FIG. 3) of over-molded assembly 100 shows the encapsulated internal PCB assembly 50. As shown in the cross-section of FIG. 5, relatively thin webs 41, 42 of encapsulating material 40 cover the top surface 134 of core piece 120 and the bottom surface 136 of core piece 122. Forming a thin wall of encapsulant over the core may be problematic. For example, air voids may form due to inadequate mold flow, or blistering may occur due to contaminants in the core, e.g. silicone used in the manufacture of ferrite cores. Certain permeable magnetic materials, such as ferrites, are hygroscopic and may absorb moisture from the atmosphere. As a transformer heats up during operation, the entrapped moisture may escape causing blistering of the encapsulant above the core. The overmolded assembly 100 may therefore require baking the moisture out of the cores prior to encapsulation which can be costly in terms of both time and energy. Increasing the thickness of the encapsulant over the cores may be undesirable for the resulting increase in package thickness and increase in thermal resistance through the encapsulant for electronic components mounted on the PCB. Grooves 135 and bevels 138 may be added to the core surfaces 134, 136 to minimize the area and increase the physical integrity of the otherwise thin webs 41, 42 of encapsulant. Such features may increase the resistance against but do not eliminate blistering and void formation.

An improved over-molded electronic assembly 200 and an improved core structure 210 is illustrated in FIGS. 6 through 9 and FIGS. 18A-18B, respectively. Module 200, like module 100 (FIGS. 3-5), may be formed by over-molding the electronic assembly with an encapsulating material 40. Unlike module 100, the core surfaces 234, 236 are exposed in the improved assembly 200, providing potential improvements in thermal performance, efficiency, reliability, and manufacturing yield as discussed in more detail below. As shown, the exposed core assembly 200 includes a PCB assembly (similar to that described above with reference to FIGS. 1 and 2) including PCB 10 but with an improved core structure 210 (FIG. 18A-B) described below. Other selections, configurations, and arrangements of components or PCB assemblies may be used in the exposed core package 200.

Referring to the FIG. 5, which shows a prior art planar magnetic core in cross section, the windings (16 in FIG. 1) on PCB 10 extend, and therefore current flows, into and out of the page setting up a magnetic field with a flux path encircling the openings 160. Note that the prior art planar magnetic structure has relatively sharp, small-radii corners along the inside perimeter of the magnetic path creating substantially rectangular openings 160 in the core assembly. These essentially squared corners, ubiquitous in planar magnetic structures, help to maximize the space available for the PCB windings and clearance to the core for a given core size. The interior corners of many planar magnetic structures are also made to include a trench around the core legs, i.e., a negative radius at the corner, to ensure that any interior bevels are removed from the opening, e.g. to ensure a tight fit with the PCB. Although the sharp corners allow for larger windings, with the objective of reducing winding resistance, they can cause a concentration of flux around the corners. The concentration of flux can create localized hot spots in the permeable material due to saturation at high frequency. Ironically, planar cores should be made to enable higher operating frequencies to reduce the size of power converters.

Figure 19A:
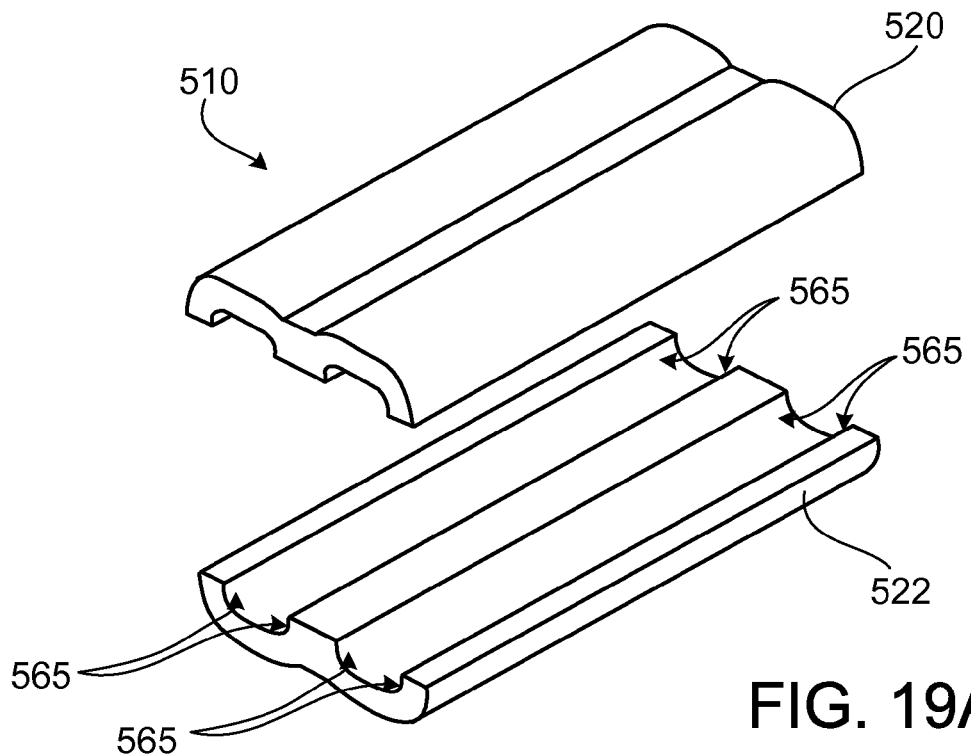
FIGS. 19A and 19B are respectively exploded perspective and cross-sectional views of a second improved core structure.
Figure 19B:
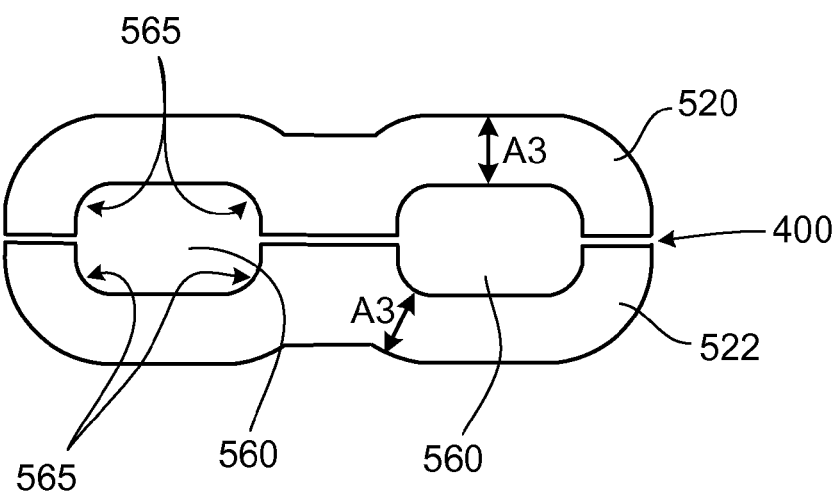

An improved high-frequency planar core configuration is illustrated in FIGS. 19A-19B. In the exploded perspective view of FIG. 19A, two mating core halves 520, 522 are shown separated and facing each other. A cross-section of the assembled core 510 is shown in FIG. 19B. The core pieces may be assembled together separated by a gap 400 which preferably may be divided between the center and outer legs. The gaps 400 may be formed in various ways, including the use of flat shims or balls of fixed diameter suspended in an adhesive between the core pieces. Depending upon the specific requirements, the gap 400 may be increased, decreased, or eliminated completely.

As shown in FIG. 19B, the cores form two loops of permeable material for directing magnetic fields within the core. Each loop surrounds a respective opening 560 and includes two respective air gaps 400. Note that core 510 is constructed for use with the same winding orientation shown in FIG. 1, extending, and thus current flowing, into and out of the page in the cross section of FIG. 19B. The flux path of the resulting magnetic field is in the plane of the page surrounding the openings 560 in the cross-section of the core 510. The cross-section of the core 510 as shown in FIG. 19B approximates two end-to-end oblong toroids. As shown, the core 510 includes a substantially uniform thickness A3, where the thickness may be defined in the direction perpendicular to the magnetic flux path through the permeable material, e.g. from the inner perimeter to the outer perimeter of the magnetic path. As revealed by the shape of the openings 560, the core includes large radii bends 565 along the inner perimeter and a rounding of the exterior edges along the outer perimeter of the magnetic path through the permeable core.

Figure 18A:
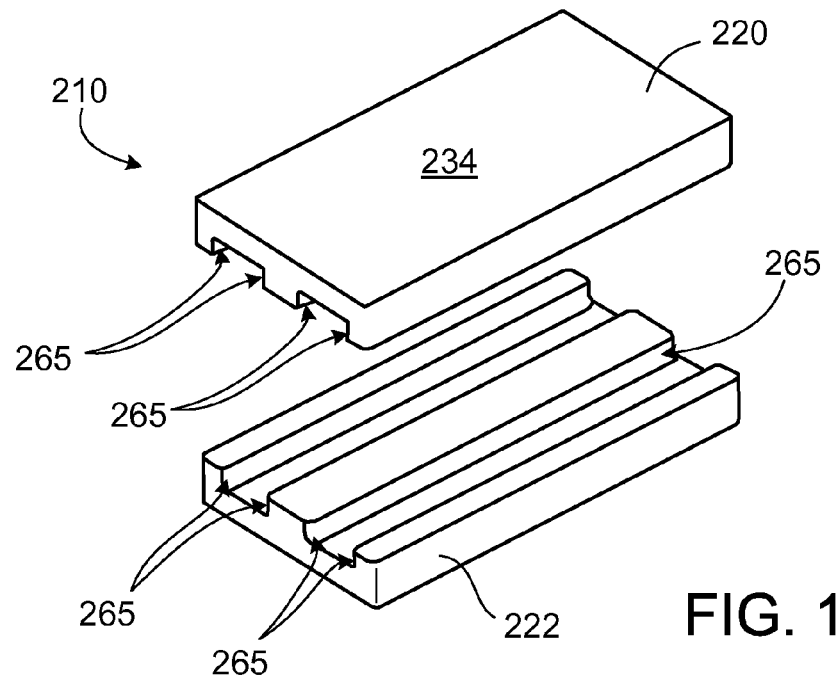
FIGS. 18A and 18B are respectively exploded perspective and cross-sectional views of an improved core structure.
Figure 18B:
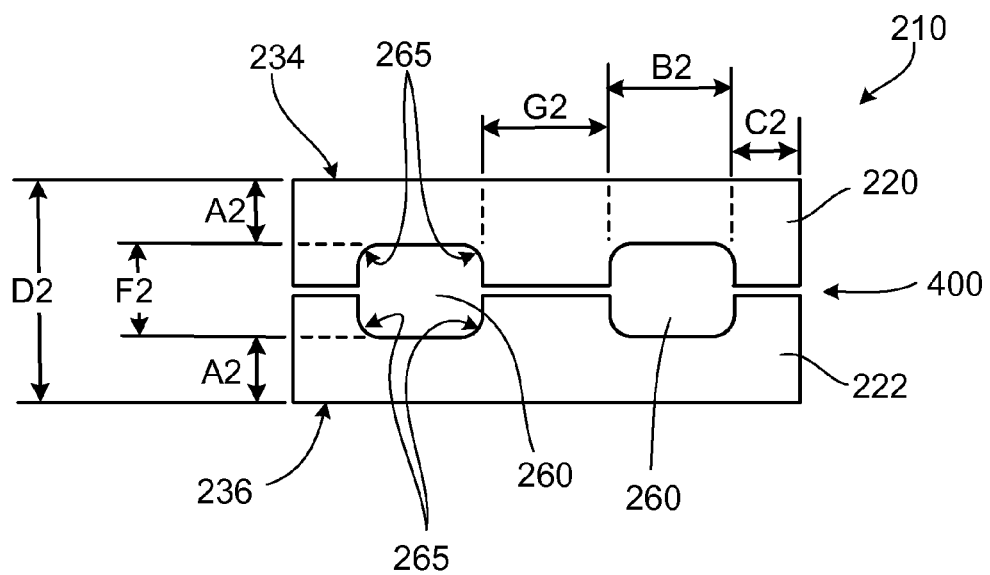

Referring to FIGS. 18A and 18B, a modified improved high-frequency planar core structure 210 adapted for use in the exposed core package 200 is shown. In the exploded perspective view of FIG. 18A, two matching core halves 220, 222 are shown separated and facing each other. The core pieces may be assembled together with or without a gap 400 as discussed above in connection with FIG. 19. As shown in the cross-section of FIG. 18B, the assembled core 210 forms a magnetically permeable path with gaps 400, preferably divided between the center and outer legs. The magnetic path surrounds two openings 260, which, like the core 510 of FIG. 19, includes large inner radii bevels or bends 265 along the inner perimeter of the magnetic flux paths.

The radius of the bends 265, 565 are a substantial fraction of the core thickness A2, A3, where the thickness may be defined in the direction perpendicular to the magnetic flux path through the core, e.g. from the inner perimeter to the outer perimeter of the magnetic path. For example, assuming the magnetic path has a thickness A2 (FIG. 18B) or A3 (FIG. 19B) the minimum radius of bevels 265 or 565 respectively may be greater than or equal to 15% and may be beneficially increased to 25%, and preferably 35%, or even 50% of the thickness A2, A3 of the magnetically permeable path to help reduce concentration of the magnetic field around bends along the inner perimeter of the magnetic path and the losses associated with it. The large radii bends 265, 565 of planar cores 210, 510 along the inner perimeters of the magnetic flux path help reduce or eliminate concentration of the magnetic field around the bends, increasing efficiency. Increases in the internal radii beyond 35% to 50% may overly reduce the amount of space available for the windings in any given core and increase the volume of the core causing increased core loss. As discussed in more detail below, the large radii bends in combination with other improvements enable higher frequency converter operation, reduction in converter size, increase in converter power density, faster dynamic response, and increase in efficiency of the core. Unlike the more idealized core 510 (FIG. 19B), core 210 (FIG. 18B) has substantially flat top 234 and bottom 236 surfaces which make it particularly amenable for use in the exposed core package 200 discussed in detail below. The squaring of the core along the outside perimeter of the magnetic path has a minimal negative impact on flux crowding and efficiency compared with squaring of the inside corners of the core along the inner perimeter of the flux path.

Figure 9:
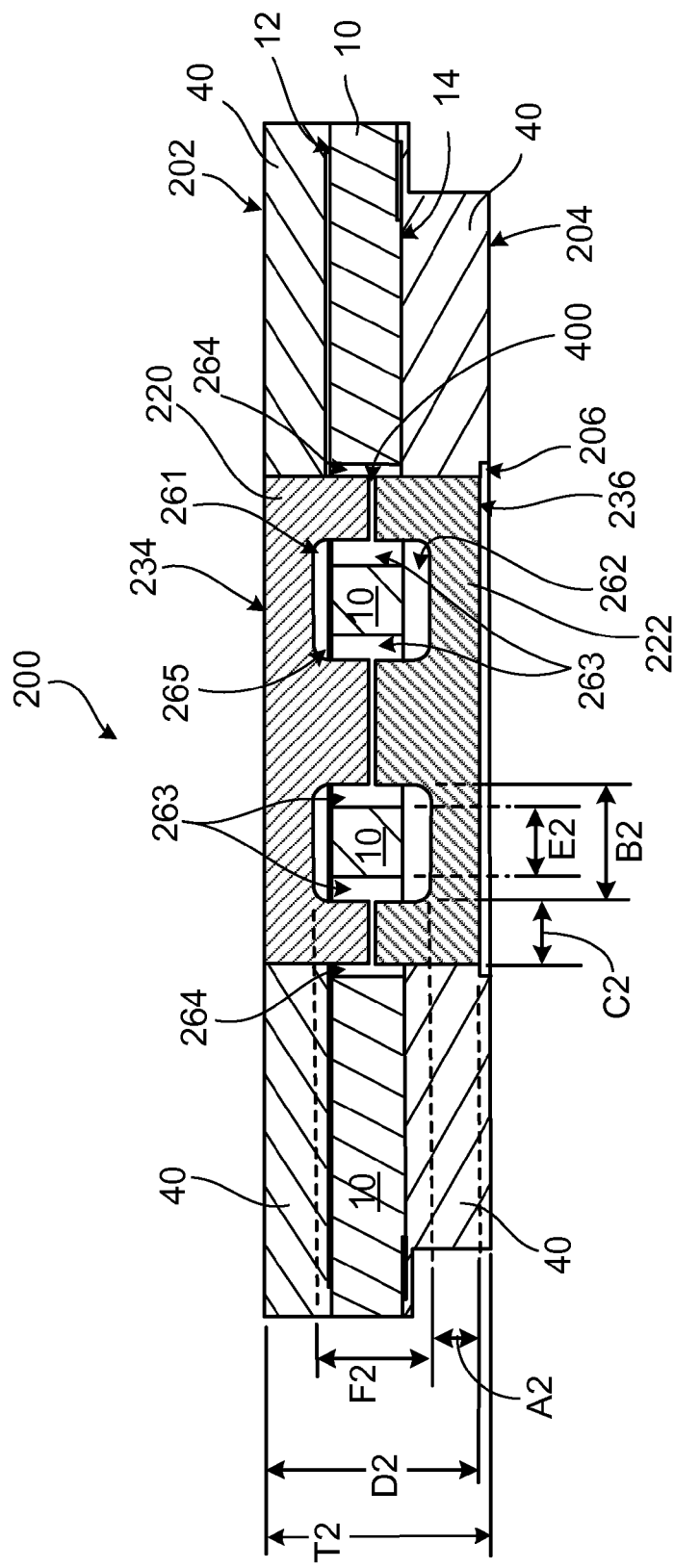

Although the rounded openings 260, 560 in the core reduce the area available for the windings, the width of the winding conductors is reduced in FIG. 9 rather than using larger openings. Perhaps counter-intuitive because of the increase in DC resistance in the windings, narrowing the windings can have a net effect of increasing the overall efficiency of converters in which the magnetic structure is used as an inductor or flyback transformer. Using narrower winding conductors increasing the separation of the conductors from the gaps 400 helps reduce high frequency eddy current losses induced in the windings by the fringing fields. Splitting the gap between the center and outer legs as shown helps not only reduce the fringing fields by shortening each gap by a factor of two, but also helps to better distribute the current density by attracting current to the outside edges of the windings in addition to the inside edges. The width of the windings may be reduced significantly without incurring an efficiency penalty. Winding widths as small as half of the core thickness may be used in the cores 210, 510 of FIGS. 18A, 18B, 19A and 19B. Since the current distribution in the winding conductors at high frequencies is in the edges near the gaps, the increase in DC resistance may be more than offset by the reduction in losses due to eddy currents and reduction in flux concentration at the bends along the inner perimeter of the magnetic flux paths. Thus, the improved planar magnetic structures 510, 210 of FIGS. 19A, 19B and 18A, 18B respectively may be used to improve the efficiency of the core and of the windings. For example, the core configuration 210 shown in FIG. 18A-B may achieve as much as a 20% improvement in efficiency over the prior art planar core shown in FIGS. 1-5 with comparable core and leg thickness.

Figure 6:
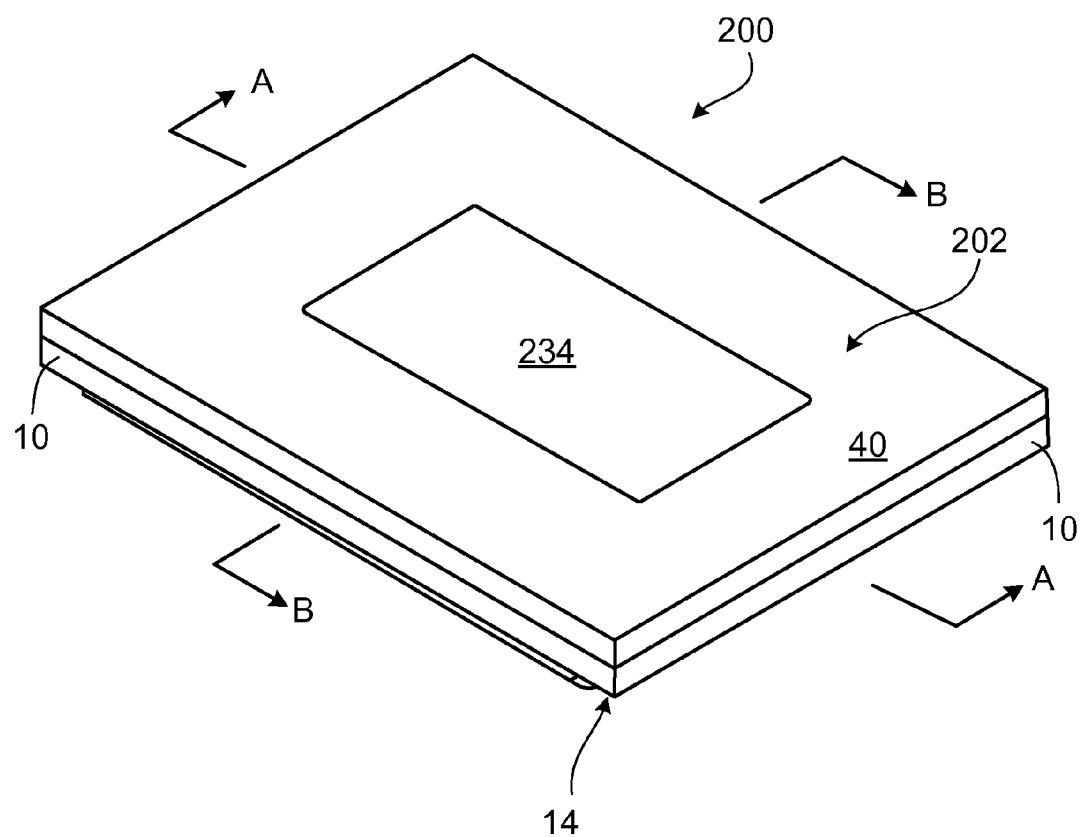
FIG. 6 is a top perspective view of an over-molded module assembly according to the invention.
Figure 7:
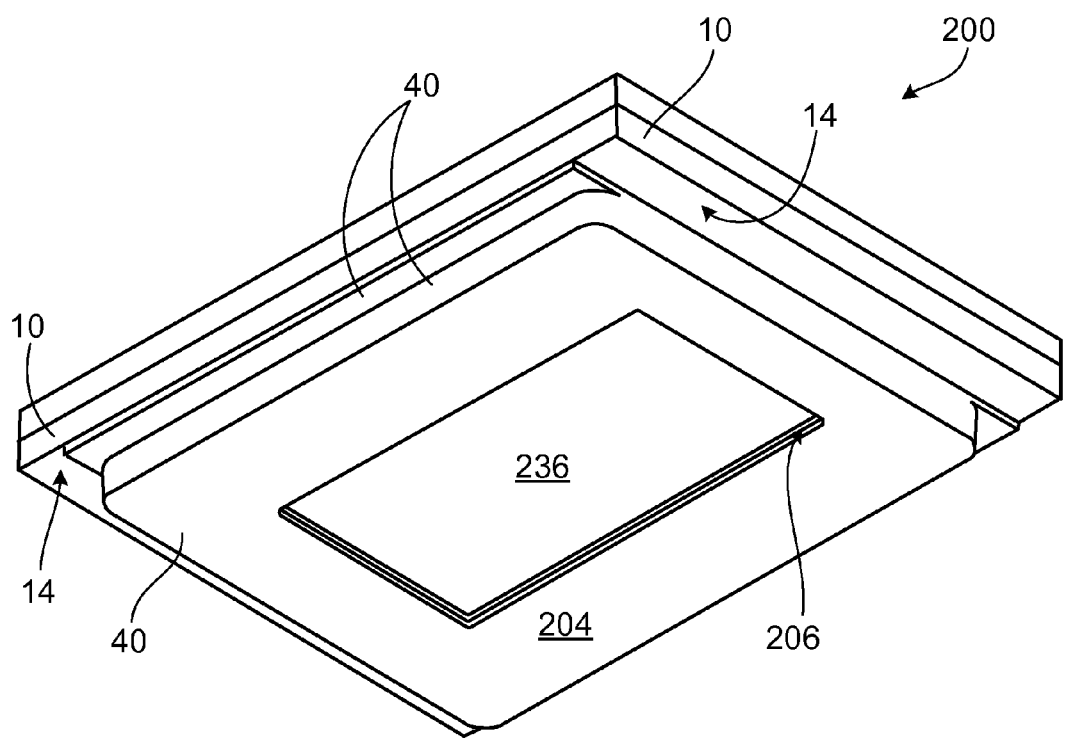
FIG. 7 is a bottom perspective view of an over-molded module assembly according to the invention.
Figure 8:
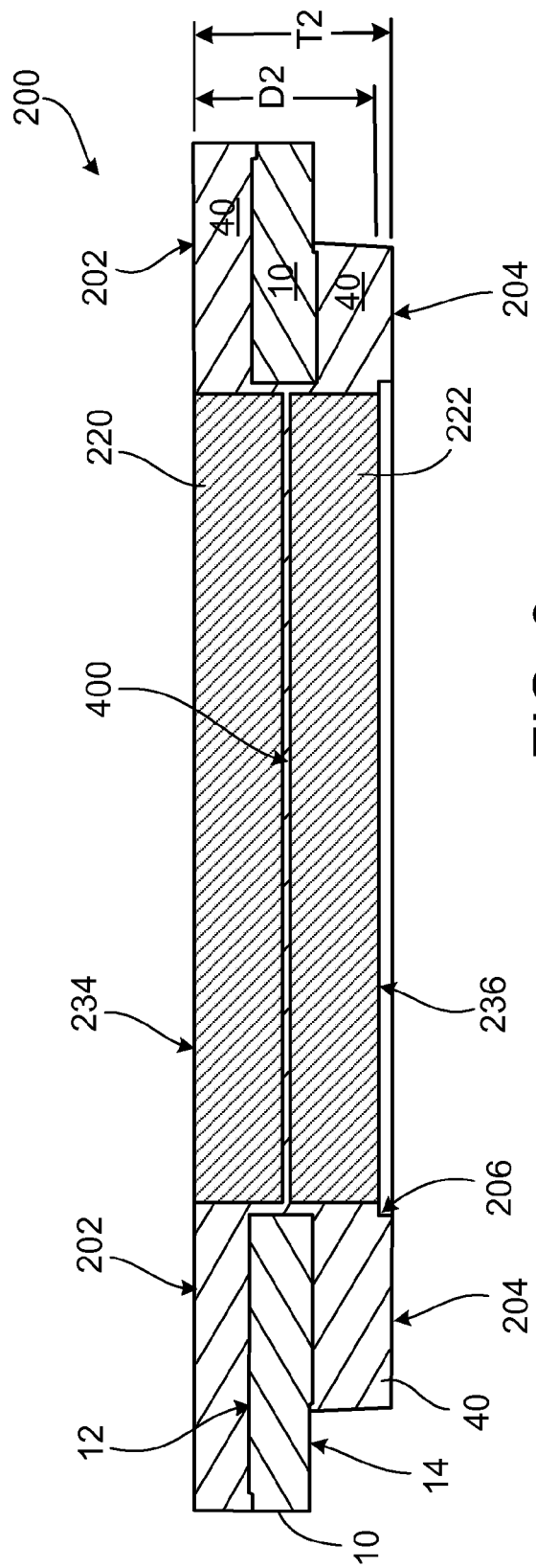
FIGS. 8 and 9 are cross-sectional views of the over-molded module assembly of FIGS. 6 and 7 respectively taken along lines A-A and B-B in FIG. 6.

Referring to FIGS. 6 (top perspective view), 8 (cross-section along A-A in FIG. 6), and 9 (cross-section along B-B in FIG. 6) which show the module 200 after encapsulation, the outer surface 234 of core piece 220 is shown exposed, i.e. not covered with encapsulating material 40. The outer surface 234 of core piece 220 is shown generally coplanar with the essentially flat top surface 202 of the over-molded assembly 200. Referring to FIG. 5 for contrast, the outer surface 134 of core piece 120 in the prior art package 100 is shown over-molded, i.e. covered with a thickness of encapsulating material 40. The outer surface 236 of core piece 222 may also be exposed as shown in FIGS. 7 (bottom perspective view), 8 (cross-section along A-A in FIG. 6), and 9 (cross-section along B-B in FIG. 6). Core surface 236 may be exposed within a recess 206 in the molded lower surface 204 as shown in FIGS. 7, 8, and 9 for example to ensure encapsulation of other components protruding from the bottom surface 14 of PCB 10. Alternatively, the depth of the recess 206 may be reduced to zero allowing core surface 236 to be coplanar with the molded lower surface 204 like core surface 234 which is coplanar with molded upper surface 202.

Keeping the core surfaces exposed reduces the thermal resistance between the core and the surface of the assembly, potentially improving heat removal. With reference to FIGS. 5 and 9, assuming the thickness of the transformer (D1, FIG. 5; D2, FIG. 9) is fixed (i.e., D1=D2), elimination of over-molding on the top of the transformer may allow the overall thickness, T2, of the assembly 200 to be reduced relative to the thickness T1 of the prior art assembly 100. The reduction in the overall thickness of the over-molding material between the other internal components, such as components 17, 19 (FIG. 1) and the outer surfaces of the module 200 may reduce the thermal resistance along that path and thereby reduce the operating temperature of the individual components and the assembly overall.

With reference to FIGS. 5 and 9, assuming the thickness of the module assembly (T1, FIG. 5; T2, FIG. 9) is fixed (i.e., T1=T2), elimination of the encapsulant 41 over the transformer may allow the overall thickness D2 of the transformer core pieces 220, 222 in assembly 200 to be increased relative to the thickness, D1, of the transformer core pieces 120, 122 in the prior art assembly 100. For an established set of operating conditions, the increased thickness D2 may allow for thicker core pieces, e.g. dimension A2 (FIG. 9) may be greater than A1 (FIG. 5), increasing the cross-sectional area and reducing flux density and ultimately reducing core losses. Assuming for example that the prior art power converter module has an overall thickness T1=6.5 mm and a transformer thickness D1=5 mm. Elimination of the 1 mm of total over-molding above and below the transformer may allow the transformer thickness to be increased to D2=6 mm, representing a 20% improvement. Because core loss is an exponential function of flux density (e.g., core loss is related to the flux density raised to the $2.9^{th}$ power), a 20% increase in cross section may result in a nearly 50% reduction in core losses. Increased core cross-section may also reduce fringing fields and eddy current losses.

The exposed core package 200 illustrated in FIGS. 6 through 9 may allow trapped moisture in the core to escape during operation without blistering, potentially eliminating the need for and the cost of baking the cores prior to encapsulation. It may also reduce mechanical stresses placed on the core potentially eliminating the need for buffer coatings and further reducing core losses. The exposed core package 200 eliminates the thin layer of encapsulation over the core and the problems associated with those layers, including void formation, increases in thermal resistance, and cosmetic defects.

Referring to FIG. 9, top 261, bottom 262, and lateral 263 interstitial gaps are created between the PCB 10 and the cores 220, 222, in the interior spaces 260 (FIG. 18B) formed between the cores. As shown in FIG. 9, lateral exterior gaps 264 are also formed between the cores and the PCB 10. The respective size of gaps 261, 262, 263, and 264 may be set to establish a minimum clearance between the core and the PCB (containing the windings) and allow encapsulate to fill those spaces during the molding process. The molding compound forms an insulating wall providing safety insulation between the primary winding and the core. In this way predetermined minimum safety spacing and dielectric insulation are provided between the core 210 and the PCB 10 ensuring that the core is properly isolated from the windings, allowing the core to be exposed and grounded or tied to the secondary winding if desired.

As illustrated in FIG. 9, the top 220 and bottom 222 E-shaped cores are fashioned to establish interior spaces 260 that are greater in height than the maximum thickness of the PCB 10 and the minimum gap size required for the top 261 and bottom 262 interstitial gaps. Compare for example, the difference in the gaps 161 and 162 of module 100 (FIG. 5) with relatively larger gaps 261 and 262 of module 200 (FIG. 9) and in the height F1 of the interior spaces of module 100 (FIG. 5) with the relatively larger height F2 of the interior spaces 260 of module 200 (FIG. 9). The minimum height F2 of interior space 260 is set to allow the assembled core 210 to move vertically relative to the PCB 10 which may be used during the manufacturing process to adjust the core surface 234 into a precise position relative to the PCB for encapsulation.

For example, the core may be moved upward into a position that will be coplanar with the top surface 202 of encapsulated module 200, i.e. in contact with the top inner surface of a mold cavity. The minimum height F2 may be set to accommodate the requisite movement, e.g. to adjust for variations in the PCB 10 thickness and core 210 dimensions, while ensuring that sufficient space remains for top and bottom interstitial gaps 261, 262, e.g. for safety and encapsulation clearances, to allow the core 210 to be positioned, e.g. a controlled distance from terminals located on the bottom surface 14 of PCB 10 or in precise relation to the top surface 202, etc.

Figure 10:
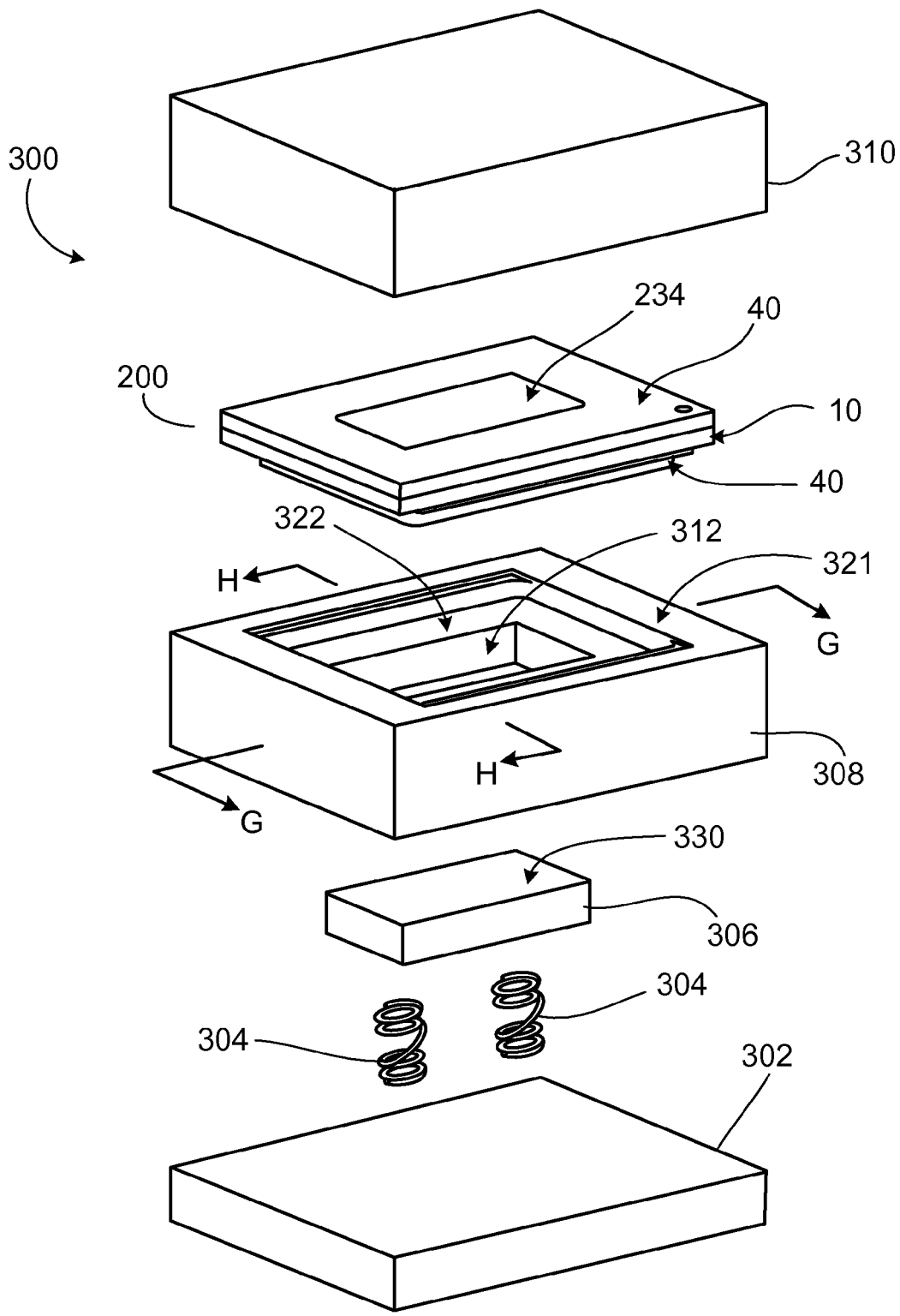
FIGS. 10 and 11 are exploded perspective views of an apparatus for molding a module according to the invention.
Figure 11:
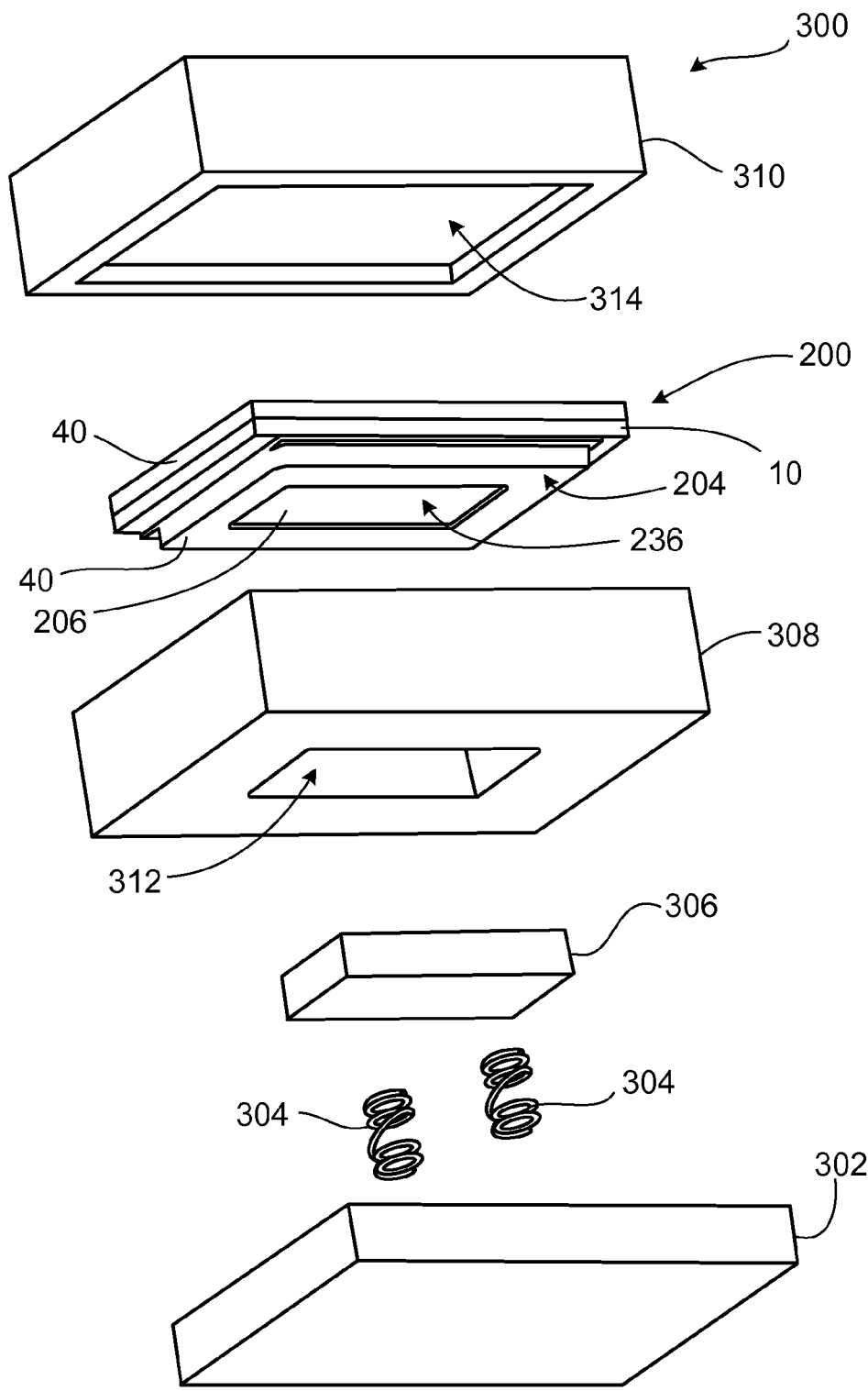
Figure 12:
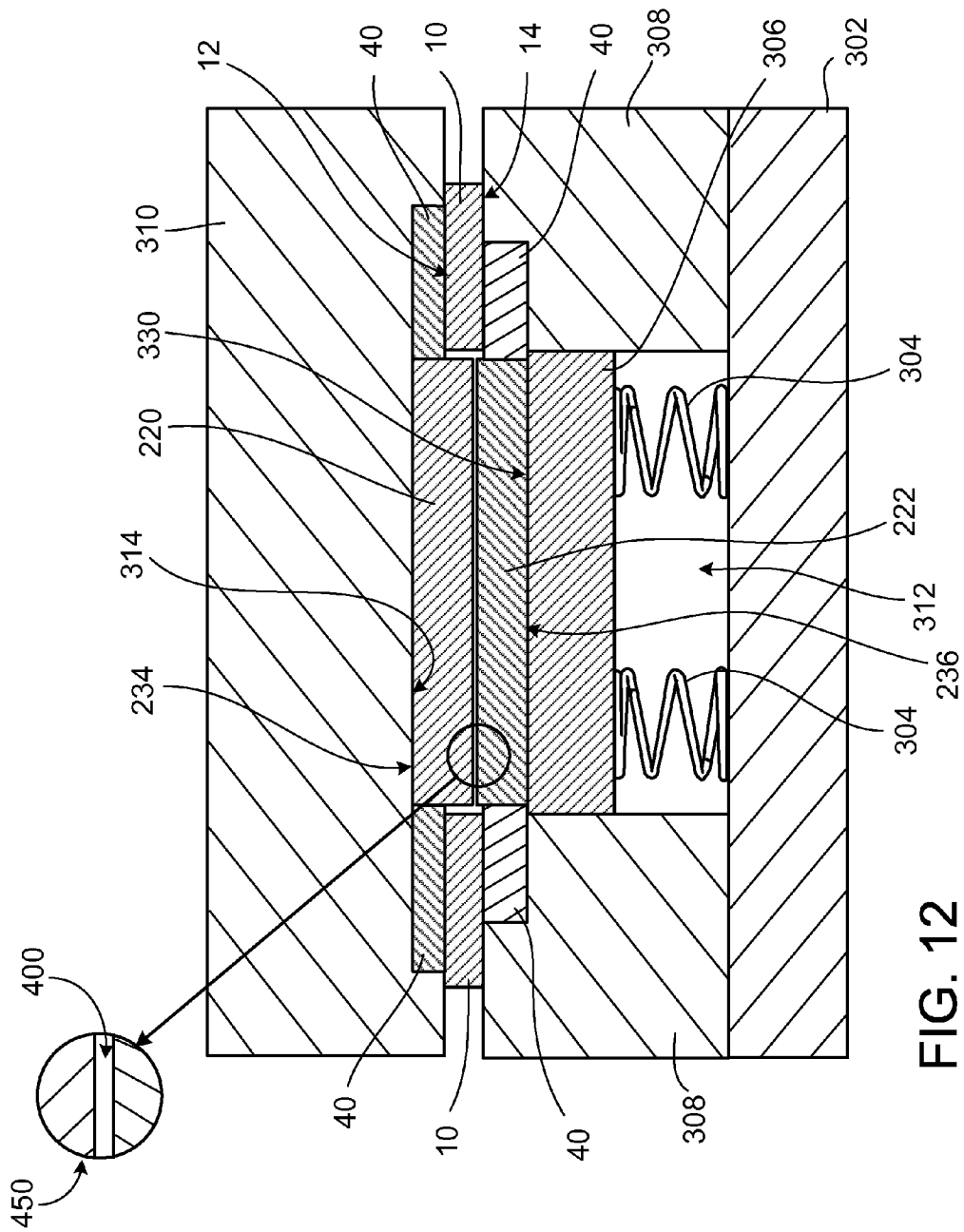
FIGS. 12 and 13A-C are cross-sectional views of the apparatus of FIGS. 10 and 11 in operation.

A molding apparatus 300 for encapsulating a PCB assembly 50 in a manner that produces the exposed core package 200 is shown schematically in FIGS. 10 through 13. FIGS. 10 and 11 show exploded perspective views of the molding apparatus 300 from above and below, respectively. FIGS. 12 and 13 show cross-sectional views through the apparatus 300 with the mold closed and in operation.

Referring to FIGS. 10 through 13C, the molding apparatus 300 may include a top mold section 310 having a recessed interior surface 314 contoured to establish the shape of the top exterior surface of the assembly 200 after the molding process. A lower base 302 may support a bottom mold section 308 and a mold insert 306, which may be biased upward by springs 304. As shown, the bottom mold section 308 includes a top surface 321, a recessed interior surface 322, and an aperture 312. The aperture 312 may have a shape that matches the insert to form a seal while allowing the insert 306 to move up and down in the aperture under pressure from the springs 304. As illustrated, the surface of the recess 322 is contoured and has a shape that together with the top surface 330 of insert 306 establishes the shape of the bottom exterior surface of the assembly 200 after the molding process.

Figure 13A:
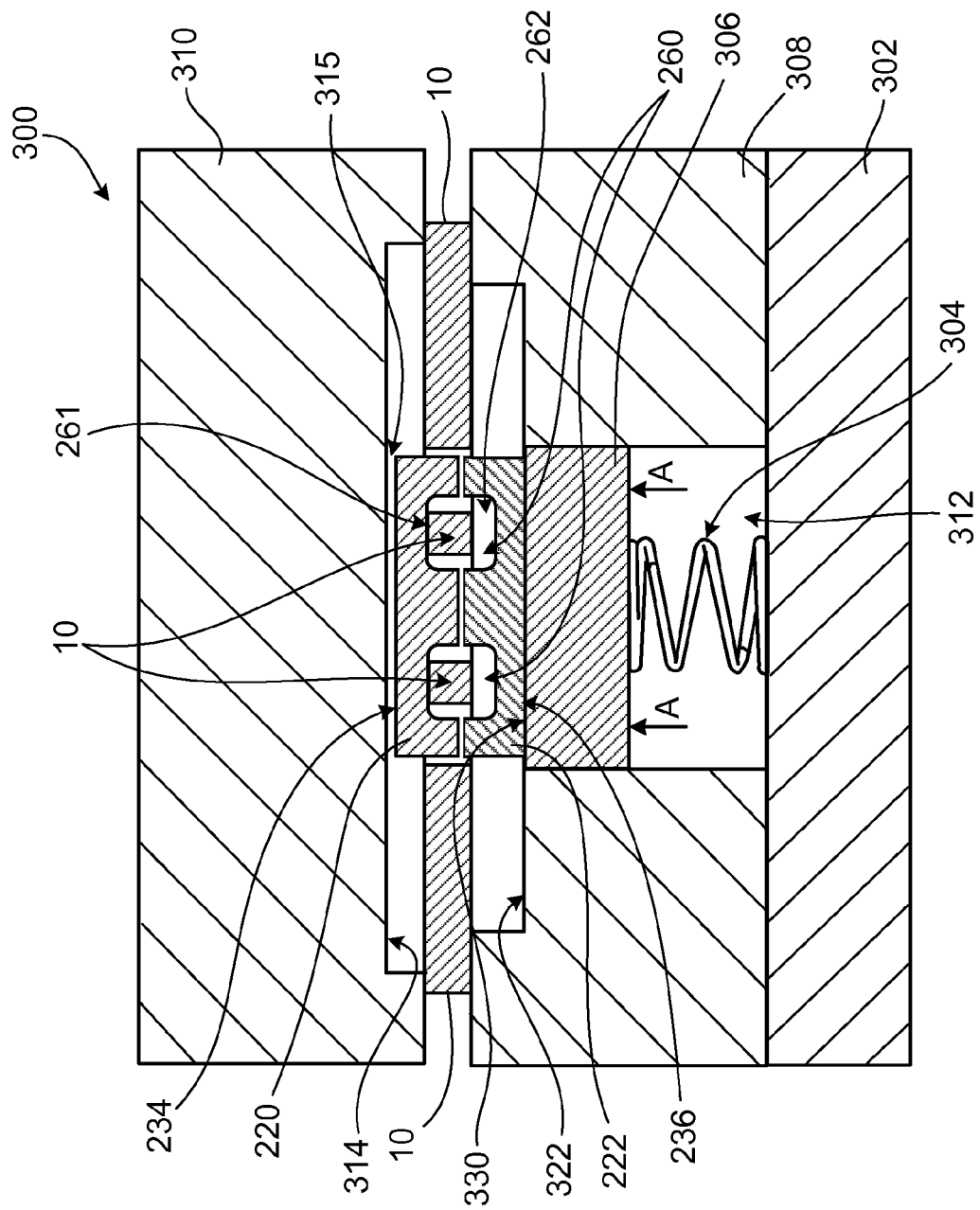
Figure 13B:
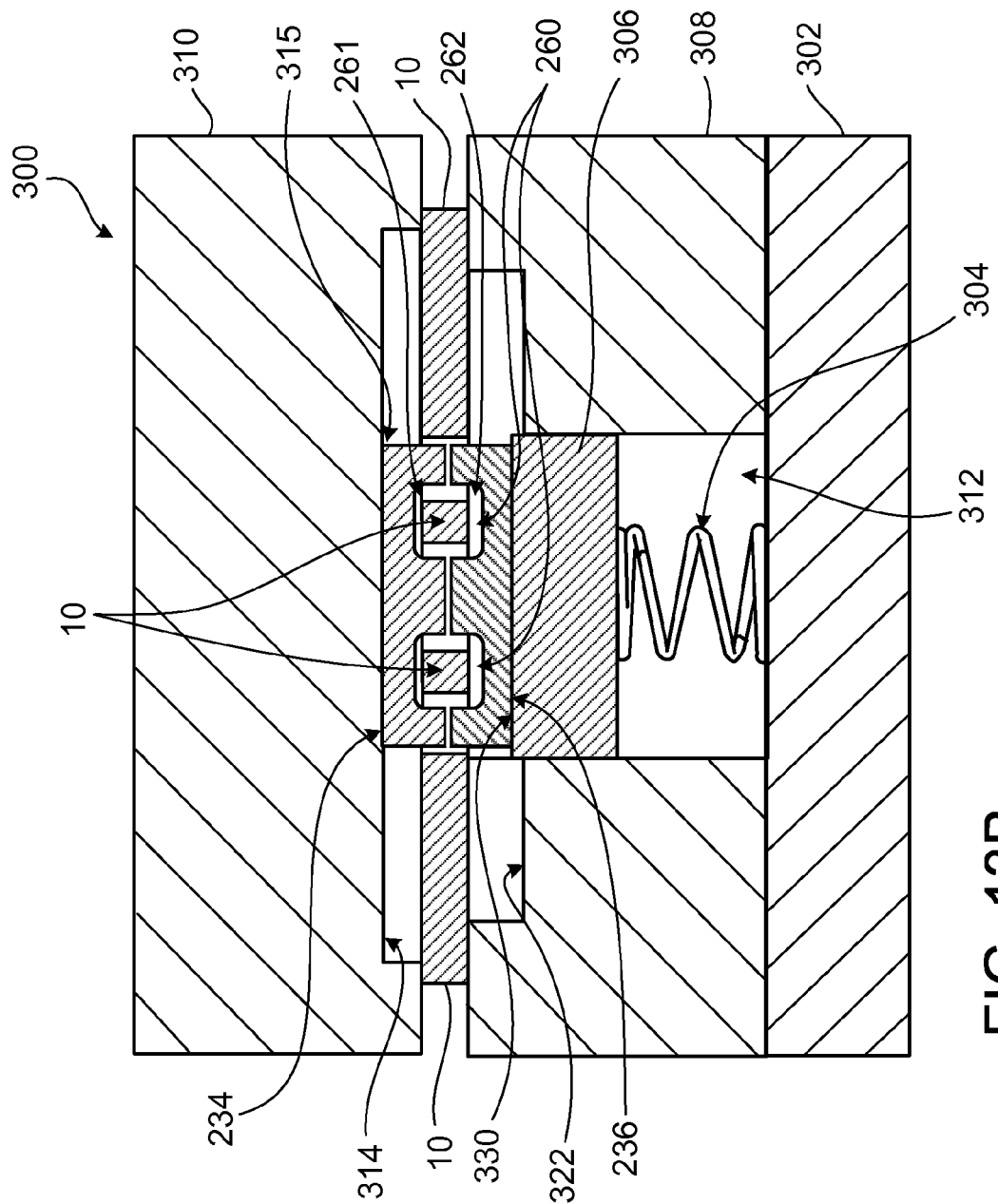
Figure 13C:
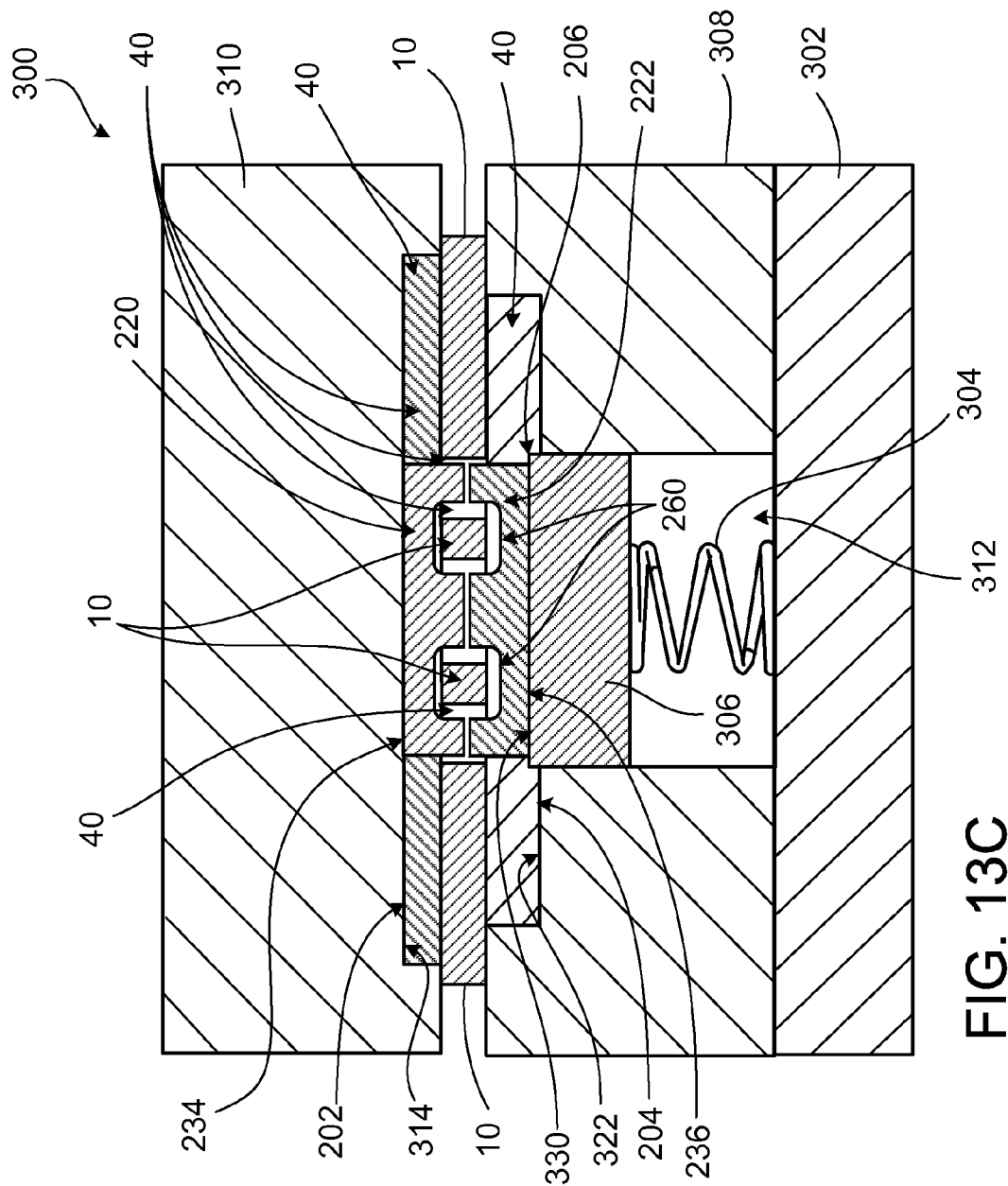

FIGS. 10 and 11 show an example of an exposed core module 200 (after encapsulation and singulation) in exploded relation to the molding apparatus 300. Note that in FIG. 10, the outer surface 234 of core piece 220 is shown exposed and coplanar with the top surface 202 of the exposed core module 200. In contrast, the outer surface 236 of core piece 222 is shown exposed within a recess 206 in the bottom surface 204 of the exposed core module 200 in FIG. 11. FIG. 12 is a cross-sectional view of the molding apparatus 300 through section G-G (FIG. 10) with the top 310 and bottom 308 molds closed against the PCB 10 of the PCB assembly and filled with an encapsulant. FIG. 13A through 13C are cross-sectional views of the molding apparatus 300 and PCB assembly at various stages during the molding process through section H-H (FIG. 10).

In operation, the top 310 and bottom 308 molds may be closed against the PCB assembly (similar to the PCB assembly 50 in FIGS. 1 and 2) each forming a seal against the PCB 10 as shown in FIGS. 12 and 13A-13C for example as described in the Molding Patents. The portions of the PCB against which the molds form a seal may be trimmed after the molding process. Alternatively, the molds may be configured to seal against each other with the PCB enclosed within the mold cavity or a combination of the two approaches in which portions of the mold cavity perimeter are sealed directly between the molds and other portions are sealed with the PCB 10 sandwiched between the top and bottom molds may be used.

As discussed above, the configuration of the core pieces is such that the assembled core may move up and down relative to the PCB 10. As the top mold section 310 and bottom mold section 308 are closed against the surfaces of PCB 10 along its outer periphery, springs 304 bias insert 306 upward within aperture 312, forcing the flat upper surface 330 of insert 306 into contact with flat surface 236 on core piece 222. Under the influence of the spring loaded insert 306, the core is moved upward with the flat upper surface 234 of core piece 220 forced into contact with flat interior surface 314 of the top mold section 310.

The sequence of FIGS. 13A through 13C illustrate movement of the mold insert 306 and the core relative to the PCB 10 under bias from springs 304 into position with core surface 234 in contact with the inner surface 314 of top mold 310. In FIG. 13A, the insert 306 and the core assembly 210 are shown in a lowered position relative to PCB 10 and top mold 310. With the core assembly 210 in a lowered position, the PCB 10 is at the top of the interior spaces 260 with the top interstitial gaps 261 minimized and the bottom interstitial gaps 262 maximized and there is a gap 315 between the inner surface 314 of the top mold and the core surface 234. (Although FIG. 13A shows the insert and core in a lowered position with the mold closed against the PCB 10, in practice the insert and core may be moved into the final position as the mold is closed against the PCB 10 rather than afterward as illustrated.) In FIG. 13B, the springs 304 have forced the insert upward moving the core into position with core surface 234 against the inner surface 314 of top mold 310 eliminating the gap 315. The interstitial gaps 261 and 262 are shown more balanced in FIG. 13B. With the core in position, FIG. 13C shows the top 310 and bottom 308 molds filled with an encapsulant 40.

After the mold is closed, encapsulant is forced into the mold, filling all empty spaces within the mold, including the top 261, bottom 262, interstitial side 263, and exterior side 264 gaps between the core pieces 220, 222 and the PCB 10 (FIG. 9). Because core surfaces 234 and 236 are in respective contact with mold surfaces 314 and 330, they remain free of over-molding and exposed in the final encapsulated assembly 200.

PCB assemblies having identical exterior package shapes may be adapted to different operating configurations. Consider for example, a series of power converters (with the same package) having different input voltages, output voltages, and power ratings. Such variations in operating configurations may require inductive components, such as transformers, that differ in properties and further requiring core pieces that differ in, e.g. thicknesses, in core gaps 400, and in construction. Variations in the core gaps 400 or in the thickness A2 of the cores or the length of the core legs may cause variations in the thickness dimension (e.g., thickness D2, FIGS. 8, 9, 18) of the assembled core 210. It will be evident from the above description that such variations in thickness (e.g., due to tolerances within a particular converter model or due to parametric differences between converter models in the series) may be accommodated by a single general purpose molding apparatus. The core 210 of each assembly is configured with the requisite minimum height F2 to be positioned properly for encapsulation and ensure the minimum safety clearance. The top core surface 234 may be positioned flush with the top surface 202 of the encapsulated assembly 200 with the bottom core surface 236 recessed to accommodate the variations. Referring to FIG. 12, the overall thickness of the core assembly (including the gap 400 if any) will determine the position of insert 306 during encapsulation and thus the depth of the resulting recess 206. Variations in the thickness D2 of the assembled core 210 may thus be accommodated by the movable mold insert 306.

Depending upon the thickness D2 of the core and the thickness T2 of the encapsulated exposed core assembly 200, the exposed core surface 236 may be recessed within the encapsulated assembly 200 as shown in FIGS. 10 through 13;

or for thicker cores or thinner encapsulated assemblies 200, the exposed core surface 236 may be coplanar with surface 204. Alternatively, if desired, still thicker cores and thinner encapsulated assemblies may be accommodated by allowing the exposed core surface to protrude from surface 204 in which case the insert 306 would be depressed within the aperture 312 with the insert surface 330 below the mold surface 322.

Figure 14:
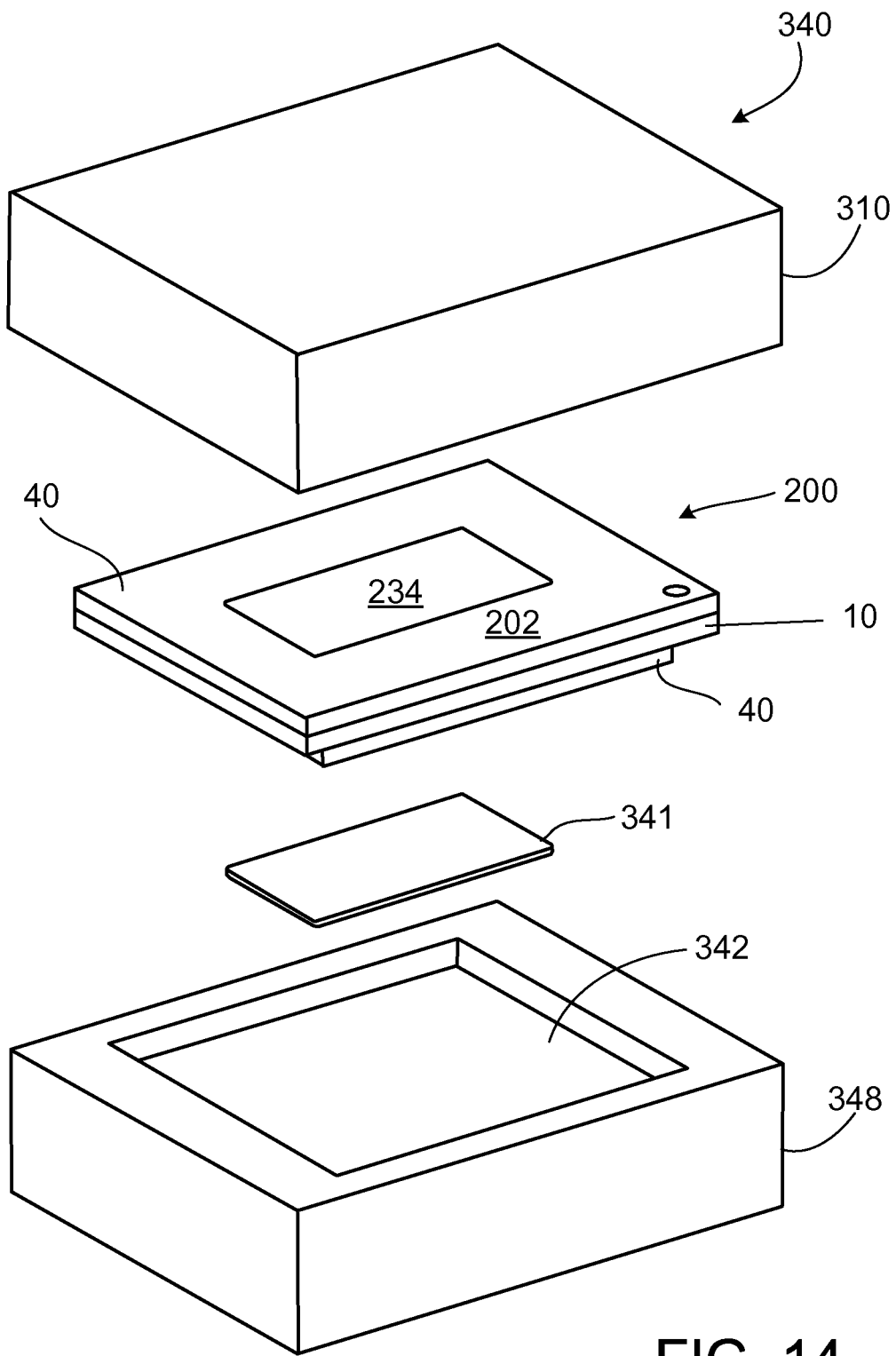
FIGS. 14 and 15 are exploded perspective views of second apparatus for molding a module according to the invention.
Figure 15:
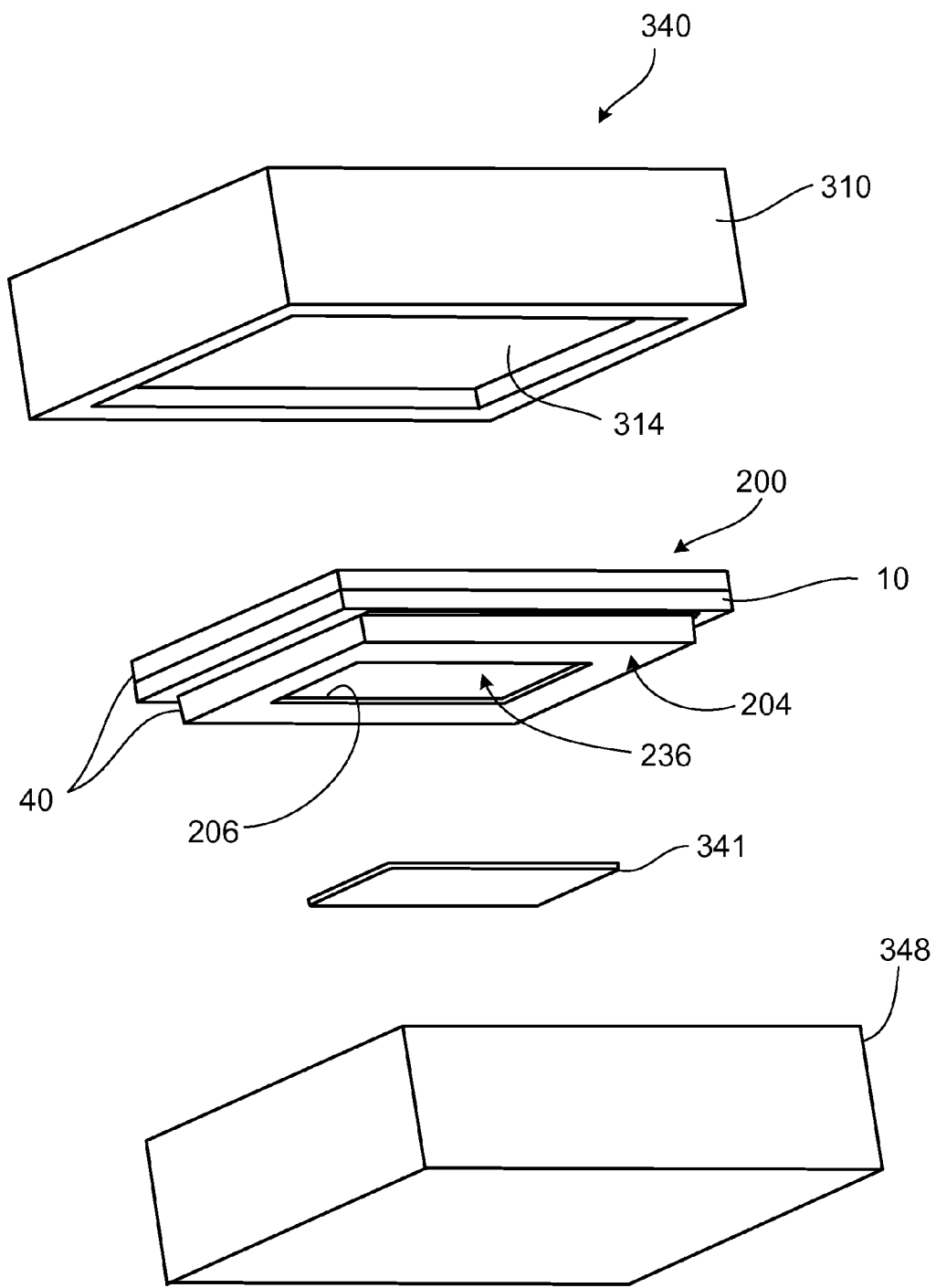

Referring to the exploded views of FIGS. 14-15 an alternative molding apparatus 340 for making the exposed core assembly 200 is illustrated. As shown the lower mold 308 including the aperture 312, springs 304, and insert 306 of molding apparatus 300 (FIGS. 10-13C) have been replaced by a simplified lower mold 348. Lower mold 348 contains an inner contour 342 for forming the lower exterior surface of the exposed core assembly 200. However instead of using the moveable insert 306 under the force of springs 304 to move the core 210 into position for encapsulation (FIGS. 10-13C), a compliant pad 341, e.g. made from silicon rubber, may be used. The compliant pad 341 may be sized to match and pre-assembled onto the bottom surface 236 of the core 210 prior to insertion into the molding apparatus 340. As the mold 340 is closed on the PCB assembly, the compliant pad biases the core 210 upward against the inner surface of top mold 310 and compresses to absorb any dimensional deviations among cores. A predetermined amount of compression in the pad ensures that the encapsulant does not cover lower core surface 236. The thickness of the compliant pad 341 may be selected to accommodate core assemblies having different thicknesses D2 (FIG. 9). For example, a thinner core may use a thicker pad and vice versa. Using the compliant pad, the molding apparatus 340 produces the exposed core package 210 with core surface 234 exposed and coplanar with the surface 202 and core surface 236 exposed within a recess 206 in surface 204.

Figure 16:
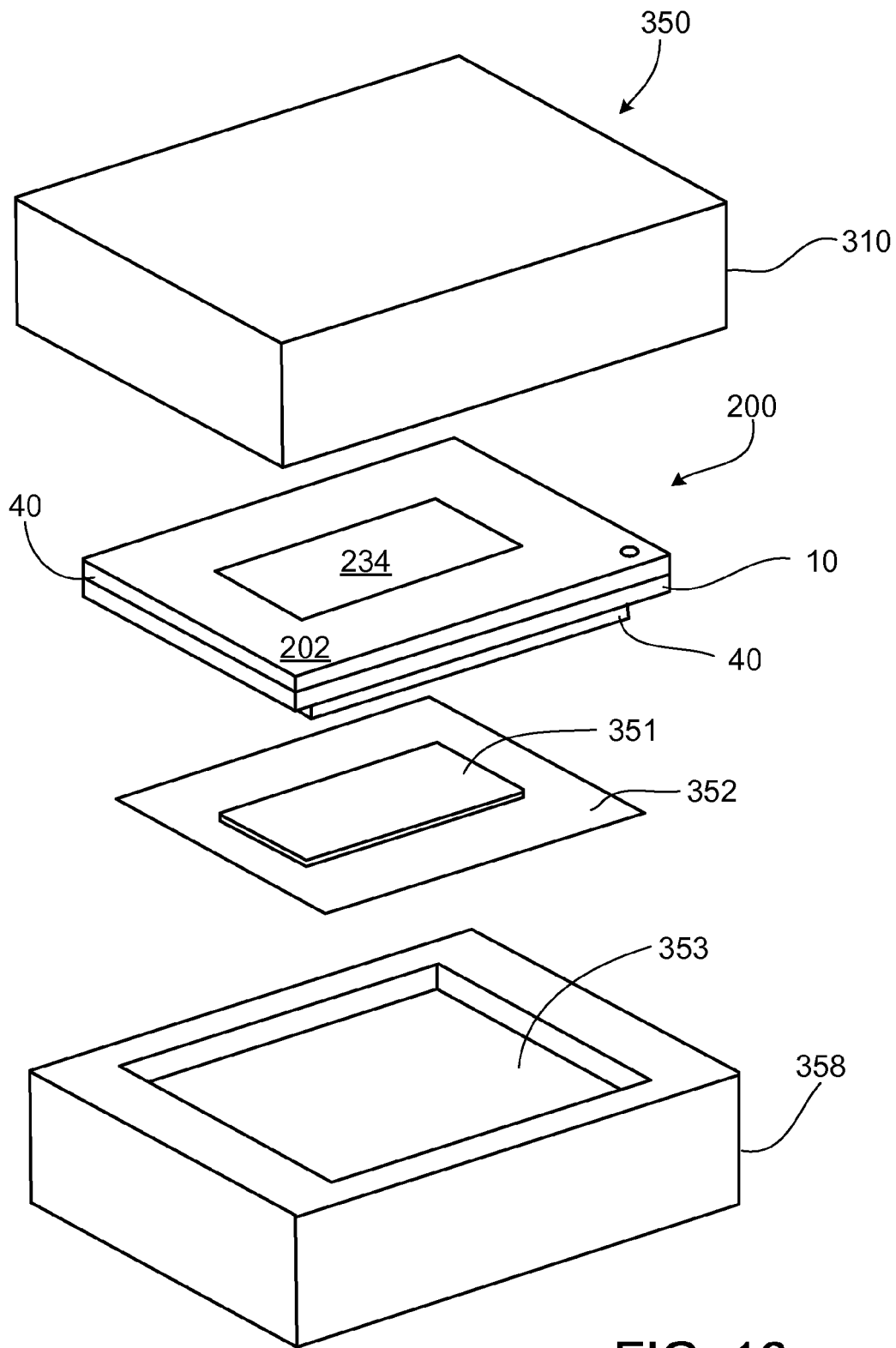
FIGS. 16 and 17 are exploded perspective views of a third apparatus for molding a module according to the invention.
Figure 17:
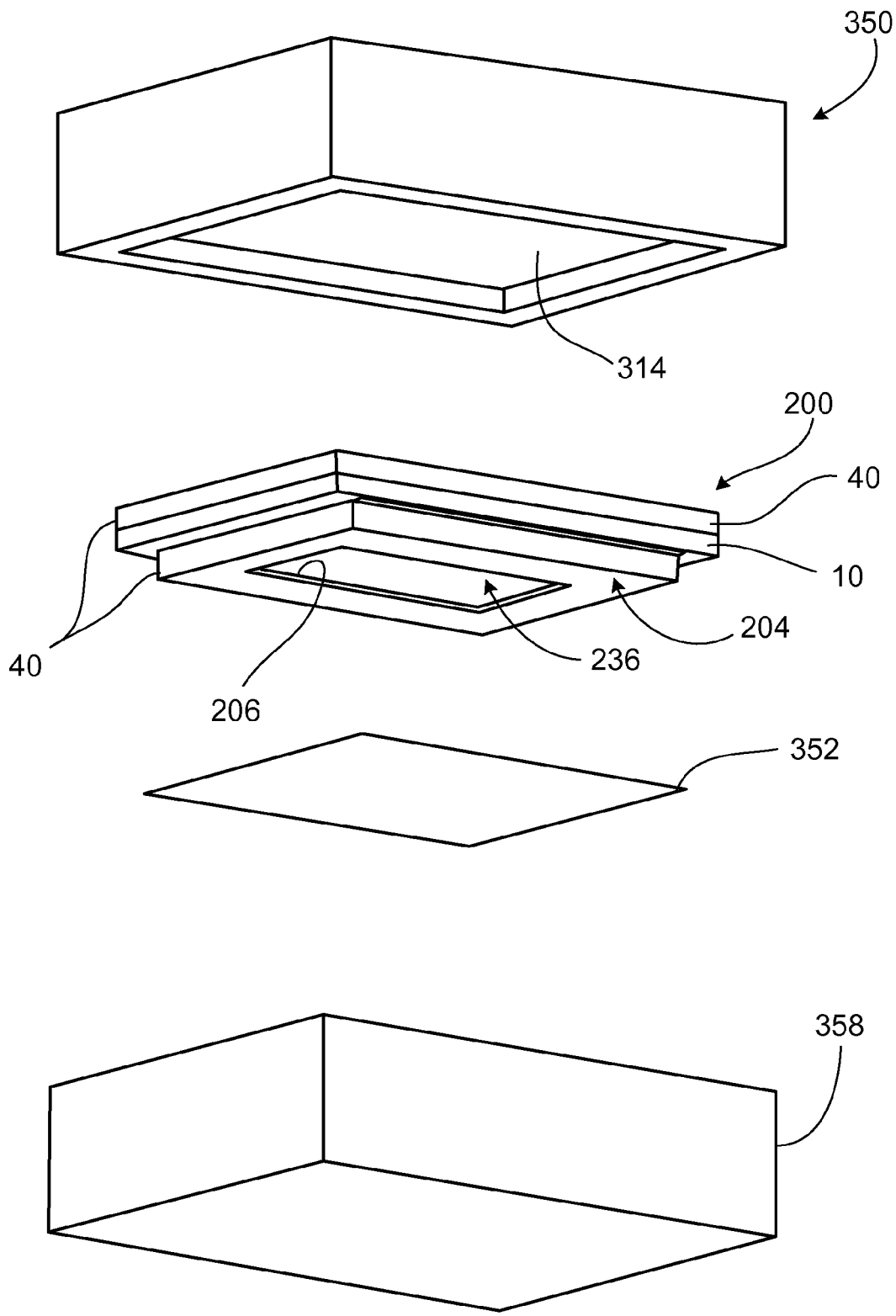

An alternative molding apparatus 350 is shown in the exploded views of FIGS. 16 and 17. Like apparatus 340 in FIG. 14-15, a lower mold 358 (similar to lower mold 348) is used in place of the lower mold 308, aperture 312, springs 304, and insert 306 used in apparatus 300 of FIGS. 10-13C. In apparatus 350, however, the compliant pad 351 is attached to a thin carrier film 352 that registers with lower mold 358 to position the pad 351. The depth of the cavity in lower mold 358 may be increased relative to lower mold 348 to accommodate the thickness of the carrier film.

The molding apparatus 340 and 350 do not require movable inserts which allows assemblies with or without cores to be molded in the same apparatus. Additionally, PCB assemblies having different quantity and locations of cores may be encapsulated without changing the molds.

The benefits of the exposed core package 200 and the improved core 210 (FIGS. 9, 18A, 18B) may be illustrated by comparing the characteristics of two similar power converter modules having the same overall module dimensions. The "baseline" converter includes the prior art core and encapsulation shown in FIGS. 1-5. The "improved" version includes the improved core 210 (FIGS. 9, 18A, 18B) and exposed core package 200 (FIGS. 6-9) and will, otherwise, have a power train similar to the baseline version.

The improved converter has the following dimensions (with reference to FIG. 9): module thickness, T2=6.4 mm; core thickness D2=5.7 mm; magnetic path thickness, A2=1.7 mm; side leg thickness, C2=1.7 mm (same as the magnetic path thickness); center leg thickness, G2=3.4 mm; internal radii=0.64 mm (approx. 37% of the path thickness A2); opening width, B2=3.25 mm; overall core width=13.3 mm; and a winding-conductor width, E2=0.9 mm (note that FIG. 9 does not show the setback of the conductor from the PCB edge).

The "baseline" converter has the following dimensions (with respect to FIG. 5): module thickness, T1=6.4 mm; core thickness D1=5.0 mm; magnetic path thickness, A1=1.42 mm; side leg thickness, C1=1.42 mm (same as the magnetic path thickness); center leg thickness=2.95 mm; internal radii=0.2 mm (approx. 14% of the path thickness A1); opening width, B1=3.76 mm; overall core width=13.3 mm; and a winding-conductor width, E1=1.8 mm (note that FIG. 5 does not show details of setback of the conductor from the PCB edge). Note that the converter used as the baseline for the comparison is not purely prior art because it used a modified core having bends with a positive radius of approximately 14% of the magnetic path thickness, rather than essentially square or negative radius bends. For that reason, the comparison yields somewhat understated, but still illustrative, results.

The improved planar magnetic core structure of the improved converter showed a 45% reduction in core loss at 500 W of converter power throughput compared to the planar magnetic core structure of the baseline converter.

A number of embodiments have been described. Nevertheless, it will be understood that various modifications may be made. For example, the movable insert may define the entire bottom surface of the encapsulated assembly to avoid formation of the recess 206, allowing the overall thickness T2 (FIG. 9) of the encapsulated assembly to be defined by the thickness D2 of the core. A multi-cavity mold may include several mold apparatus 350 over which a unitary thermal film having multiple pockets with multiple compliant pads could be placed to mold several assemblies at the same time. Pins or other features may be provided in the mold to bias the core upward producing an assembly in which the top core surface is exposed and the bottom core surface is covered with encapsulant. Alternatively, fluid dynamics may be used to bias the core upward against the top mold. Advantageous results may be achieved if the steps of the disclosed techniques were performed in a modified sequence, if components in the disclosed systems were combined in a different manner, or if the described components were replaced or supplemented by other components. The disclosed systems or certain sub-components may be integrated, in whole or in part. Accordingly, other embodiments are within the scope of the following claims.

What is claimed is:

1. A method of forming an encapsulated electronic device comprising:
providing an electronic assembly including one or more first components, each first component having a first structure and a second structure, the first structure moveable with respect to the second structure;
providing a mold for encapsulating the electronic assembly including the one or more first components, and for forming at least a portion of an exterior shape of the encapsulated electronic device with cured encapsulant;
closing the mold around at least a portion of the electronic assembly including the one or more first components;
for at least one of the one or more first components, positioning the first structure of the first component relative to the second structure of the first component within a cavity of the mold; and
filling the cavity of the mold with an encapsulating material to surround the portion of the electronic assembly including the one or more first components.

2. The method of claim 1 wherein the positioning comprises clamping the second structure relative to the mold and biasing the first structure in position against a predetermined feature of the mold.

3. The method of claim 2 wherein the predetermined feature is an inner surface of the mold.

4. The method of claim 2 wherein the biasing comprises using a compliant pad between the mold and the first structure to apply compliant pressure to the first structure.

5. The method of claim 4 wherein the compliant pad is affixed to the first structure before closing the mold around the electronic assembly.

6. The method of claim 4 wherein the compliant pad is affixed to a sheet and further comprising placing the sheet in the mold before closing the mold around the electronic assembly.

7. The method of claim 2 further comprising providing a moveable insert in a portion of the mold, the moveable insert having an insert surface for engaging and applying pressure to the first structure.

8. The method of claim 7 wherein the second structure comprises a printed circuit board ("PCB") and the first structure comprises a core structure for directing a magnetic field along a flux path, the core structure having a first core surface and wherein the predetermined feature is a first inner surface of the mold.

9. The method of claim 8 wherein:
the first inner surface of the mold is contoured to produce a resulting flat exterior top surface for the electronic device after encapsulation,
the first core surface is essentially flat, and
the positioning comprises moving the first core surface against the first inner surface forming a seal to leave the first core surface exposed within and coplanar with the resulting flat exterior top surface.

10. The method of claim 9 wherein
the mold insert is provided in a bottom portion of the mold, adapted to push the core structure upward against the first inner surface,
the insert surface is adapted to form a seal against a second surface of the core structure to leave the second surface of the core structure exposed within a resulting exterior bottom surface of the device.

11. The method of claim 9 wherein
the mold insert protrudes from a bottom interior surface of the mold to produce a recess in the resulting exterior bottom surface of the electronic device after encapsulation; and
the core structure is exposed within the recess.

12. The method of claim 11 further comprising
adapting the core structure to move over a range relative to the PCB; and
providing a minimum clearance between the core structure and the PCB over the range.

13. The method of claim 12 wherein the encapsulated electronic device comprises a power converter.

14. The method of claim 1 wherein one of the one or more first components comprises an inductive component, the first structure comprises a magnetically permeable core structure and the second structure comprises a printed circuit board including a conductive winding magnetically coupled to the core structure to form the inductive component.

15. A method of forming an encapsulated electronic device comprising:
providing an electronic assembly including a first component having a first structure moveable with respect to a second structure;
providing a mold for encapsulating the electronic assembly and for forming at least a portion of an exterior shape of the encapsulated electronic device with cured encapsulant;
closing a mold around at least a portion of the electronic assembly;
positioning the first structure relative to the second structure; and
filling the mold with an encapsulating material,
wherein the second structure comprises a printed circuit board ("PCB") and the first structure comprises a core structure for directing a magnetic field along a flux path, the core structure having a first core surface and wherein the predetermined feature is a first inner surface of the mold.

16. The method of claim 15 wherein:
the first inner surface of the mold is contoured to produce a resulting flat exterior top surface for the electronic device after encapsulation,
the first core surface is essentially flat, and
the positioning comprises moving the first core surface against the first inner surface forming a seal to leave the first core surface exposed within and coplanar with the resulting flat exterior top surface.

17. The method of claim 16 wherein
the mold insert is provided in a bottom portion of the mold, adapted to push the core structure upward against the first inner surface,
the insert surface is adapted to form a seal against a second surface of the core structure to leave the second surface of the core structure exposed within a resulting exterior bottom surface of the device.

18. The method of claim 16 wherein
the mold insert protrudes from a bottom interior surface of the mold to produce a recess in the resulting exterior bottom surface of the electronic device after encapsulation; and
the core structure is exposed within the recess.

19. The method of claim 18 further comprising
adapting the core structure to move over a range relative to the PCB; and
providing a minimum clearance between the core structure and the PCB over the range.

20. The method of claim 19 wherein the encapsulated electronic device comprises a power converter.

21. The method of claim 16 wherein the positioning comprises clamping the second structure relative to the mold and biasing the first structure in position against a predetermined feature of the mold.

22. The method of claim 21 wherein the predetermined feature is an inner surface of the mold.

23. The method of claim 21 wherein the biasing comprises using a compliant pad between the mold and the first structure to apply compliant pressure to the first structure.

24. The method of claim 23 wherein the compliant pad is affixed to the first structure before closing the mold around the electronic assembly.

25. The method of claim 23 wherein the compliant pad is affixed to a sheet and further comprising placing the sheet in the mold before closing the mold around the electronic assembly.

26. The method of claim 21 further comprising providing a moveable insert in a portion of the mold, the moveable insert having an insert surface for engaging and applying pressure to the first structure.

27. A method of forming an encapsulated electronic device comprising:
providing an electronic assembly including a first component having a first structure and a second structure, the first structure moveable with respect to the second structure;

providing a mold for encapsulating the electronic assembly and for forming at least a portion of an exterior shape of the encapsulated electronic device with cured encapsulant;

providing a moveable insert in a portion of the mold, the moveable insert having an insert surface for engaging and applying pressure to the first structure;

closing the mold around at least a portion of the electronic assembly;

positioning the first structure relative to the second structure, the positioning comprising clamping the second structure relative to the mold and biasing the first structure in position against a predetermined feature of the mold; and filling the mold with an encapsulating material, wherein the second structure comprises a printed circuit board ("PCB") and the first structure comprises a core structure for directing a magnetic field along a flux path, the core structure having a first core surface and wherein the predetermined feature is a first inner surface of the mold.

28. The method of claim 27 wherein:
the first inner surface of the mold is contoured to produce a resulting flat exterior top surface for the electronic device after encapsulation,
the first core surface is essentially flat, and
the positioning comprises moving the first core surface against the first inner surface forming a seal to leave the first core surface exposed within and coplanar with the resulting flat exterior top surface.

29. The method of claim 28 wherein
the mold insert is provided in a bottom portion of the mold, adapted to push the core structure upward against the first inner surface,
the insert surface is adapted to form a seal against a second surface of the core structure to leave the second surface of the core structure exposed within a resulting exterior bottom surface of the device.

30. The method of claim 28 wherein
the mold insert protrudes from a bottom interior surface of the mold to produce a recess in the resulting exterior bottom surface of the electronic device after encapsulation; and
the core structure is exposed within the recess.

31. The method of claim 30 further comprising
adapting the core structure to move over a range relative to the PCB; and
providing a minimum clearance between the core structure and the PCB over the range.

32. The method of claim 31 wherein the encapsulated electronic device comprises a power converter.

* * * * *